US012648182B2

(12) United States Patent
Kim et al.

(10) Patent No.: US 12,648,182 B2
(45) Date of Patent: Jun. 2, 2026

(54) DISPLAY PANEL AND METHOD OF MANUFACTURING THE SAME

(71) Applicant: Samsung Display Co., Ltd., Yongin-Si (KR)

(72) Inventors: Hyun Kim, Yongin-si (KR); Shoyeon Kim, Yongin-si (KR); Seul-Ki Kim, Yongin-si (KR); Kap Soo Yoon, Yongin-si (KR); Jaehyun Lee, Yongin-si (KR); Seung-Ha Choi, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 446 days.

(21) Appl. No.: 18/124,604

(22) Filed: Mar. 22, 2023

(65) Prior Publication Data

US 2024/0065045 A1 Feb. 22, 2024

(30) Foreign Application Priority Data

Aug. 17, 2022 (KR) ........................ 10-2022-0102835

(51) Int. Cl.
*H10K 59/124* (2023.01)
*H10D 30/67* (2025.01)
(Continued)

(52) U.S. Cl.
CPC ..... *H10D 30/6736* (2025.01); *H10D 30/6729* (2025.01); *H10D 30/6757* (2025.01);
(Continued)

(58) Field of Classification Search
CPC ................................................. H10D 30/6736
See application file for complete search history.

(56) References Cited

U.S. PATENT DOCUMENTS 10,461,141 B2 10/2019 Choi
10,553,624 B2 2/2020 Gong et al.
(Continued)

FOREIGN PATENT DOCUMENTS

CN 1790138 A * 6/2006 ......... H10D 30/6715
CN 106847744 A 6/2017
(Continued)

OTHER PUBLICATIONS

Machine translation, Li, Chinese Pat. Pub. No. CN110061064A, translation date: Aug. 22, 2025, Espacenet, all pages. (Year: 2025).*
(Continued)

*Primary Examiner* — Victoria K. Hall
(74) *Attorney, Agent, or Firm* — Innovation Counsel LLP

(57) ABSTRACT

A display panel includes a base substrate, a transistor disposed on the base substrate and including a semiconductor pattern including a source area, a drain area, and an active area, a gate insulating pattern layer disposed on the semiconductor pattern, and a gate electrode disposed on the gate insulating pattern, and connection electrodes disposed on the gate insulating pattern layer and connected to the semiconductor pattern through contact holes, respectively. The gate insulating pattern layer includes a first portion overlapping at least one of the source area and the drain area and a second portion extending from the first portion. A thickness of the first portion is equal to or smaller than about 50% of a thickness of the second portion.

20 Claims, 21 Drawing Sheets

(51) Int. Cl.

| | | |
|---|---|---|
| *H10D 86/01* | (2025.01) | |
| *H10D 86/40* | (2025.01) | |
| *H10D 86/60* | (2025.01) | |
| *H10K 59/12* | (2023.01) | |
| *H10K 59/121* | (2023.01) | |
| *H10K 102/00* | (2023.01) | |

(52) U.S. Cl.

CPC ....... *H10D 86/0231* (2025.01); *H10D 86/421* (2025.01); *H10D 86/443* (2025.01); *H10D 86/451* (2025.01); *H10D 86/60* (2025.01); *H10K 59/1201* (2023.02); *H10K 59/1213* (2023.02); *H10K 59/124* (2023.02); *H10K 2102/351* (2023.02)

(56) References Cited

U.S. PATENT DOCUMENTS

| | | | | |
|---|---|---|---|---|
| 10,811,438 | B2 | 10/2020 | Choi | |
| 11,362,163 | B2 | 6/2022 | Tang | |
| 11,476,316 | B2 | 10/2022 | Yang et al. | |
| 2006/0214229 | A1* | 9/2006 | Toyoda | H10D 86/40 |
| | | | | 257/E29.279 |
| 2009/0072729 | A1 | 3/2009 | Kim et al. | |
| 2017/0179164 | A1* | 6/2017 | Choi | H10D 86/441 |
| 2018/0366532 | A1* | 12/2018 | Park | H10K 59/1213 |
| 2019/0164999 | A1* | 5/2019 | Choi | H10D 86/60 |
| 2021/0399142 | A1 | 12/2021 | Jeong et al. | |
| 2022/0139970 | A1* | 5/2022 | Kim | H10D 86/60 |
| | | | | 257/72 |
| 2022/0173198 | A1 | 6/2022 | Kim et al. | |
| 2022/0181411 | A1 | 6/2022 | Kim et al. | |

FOREIGN PATENT DOCUMENTS

| | | | | | |
|---|---|---|---|---|---|
| CN | 110061064 | A | * | 7/2019 | ........... H10D 30/673 |
| CN | 111584509 | A | | 8/2020 | |
| CN | 112420741 | A | | 2/2021 | |
| CN | 113903751 | A | | 1/2022 | |
| KR | 10-2019-0063230 | A | | 6/2019 | |
| KR | 10-2020-0051093 | A | | 5/2020 | |
| KR | 10-2022-0080801 | A | | 6/2022 | |
| KR | 10-2431929 | B1 | | 8/2022 | |
| WO | 2021168904 | A1 | | 9/2021 | |

OTHER PUBLICATIONS

Machine translation, Takao, Chinese Pat. Pub. No. CN1790138A, translation date: Aug. 22, 2025, Espacenet, all pages. (Year: 2025).*

Extended European Search Report corresponding to Application No. 23184360.8 dated Jan. 23, 2024, 7 pages.

* cited by examiner

FIG. 9

DISPLAY PANEL AND METHOD OF MANUFACTURING THE SAME

This U.S. non-provisional patent application claims priority under 35 U.S.C. § 119 to Korean Patent Application No. 10-2022-0102835, filed on Aug. 17, 2022, the contents of which are hereby incorporated by reference in its entirety.

BACKGROUND

1. Field of Disclosure

The present disclosure relates to a display panel and a method of manufacturing the display panel.

2. Description of the Related Art

Multimedia display devices, such as televisions, mobile phones, tablet computers, computers, navigation units, and game units, include a display panel to display images. The display panel includes pixels displaying the images, and each of the pixels includes a light emitting element emitting light and a driving element connected to the light emitting element.

The light emitting element and the driving element of the display panel are formed by stacking thin layers and patterning the thin layers using a mask. Since a display panel manufacturing process using a mask requires a lot of cost, it is necessary to reduce the number of masks used to manufacture the display panel by simplifying the display panel manufacturing process. In addition, it is required to manufacture the display panel with reliability while simplifying the manufacturing process.

SUMMARY

The present disclosure provides a display panel with improved reliability by preventing blocking a current path and increasing a resistance of a transistor.

The present disclosure provides a method of manufacturing the display panel.

Embodiments of the inventive concept provide a display panel including a base substrate, a transistor disposed on the base substrate and including a semiconductor pattern including a source area, a drain area, and an active area, a gate insulating pattern layer disposed on the semiconductor pattern, and a gate electrode disposed on the gate insulating pattern, and connection electrodes disposed on the gate insulating pattern layer and connected to the semiconductor pattern through contact holes, respectively. The gate insulating pattern layer may include a first portion overlapping at least one of the source area and the drain area and a second portion extending from the first portion. A thickness of the first portion may be equal to or smaller than about 50% of a thickness of the second portion.

The first portion may be in contact with at least one of the source area and the drain area.

The thickness of the first portion may be equal to or smaller than about 500 angstroms.

The second portion extends from the first portion to a first direction in a plan view, and a width of the first portion in the first direction may be equal to or greater than about 0.2 micrometers.

The connection electrodes may include a first connection electrode connected to the drain area and a second connection electrode connected to the source area, and the first connection electrode and the second connection electrode may be disposed on a same layer as a layer on which the gate electrode is disposed.

The first connection electrode and the second connection electrode may be consist of a same material as the gate electrode.

The display panel may further include a first conductive pattern and a second conductive pattern disposed between the base substrate and the transistor and spaced apart from each other in a plan view. The first conductive pattern may be electrically connected to the drain area via the first connection electrode, and the second conductive pattern may be electrically connected to the source area via the second connection electrode.

The gate insulating pattern layer may include a first insulating pattern, a second insulating pattern, and a third insulating pattern spaced apart from each other in a plan view, the first insulating pattern may be disposed between the first connection electrode and the semiconductor pattern, the second insulating pattern may be disposed between the gate electrode and the semiconductor pattern, and the third insulating pattern may be disposed between the second connection electrode and the semiconductor pattern.

The first conductive pattern may overlap the semiconductor pattern in a plan view.

The first connection electrode may be connected to the first conductive pattern via a first contact hole defined through the first insulating pattern. The first insulating pattern may include a first portion disposed adjacent to the first contact hole and a second portion extending from the first portion of the first insulating pattern, and a thickness of the first portion of the first insulating pattern may be equal to or smaller than about 50% of a thickness of the second portion of the first insulating pattern.

The display panel may further include a buffer layer disposed between the gate insulating pattern layer and the first and second conductive patterns, and the first contact hole may be defined through the buffer layer and the first insulating pattern.

A side surface of the second portion of the first insulating pattern connected to the first portion of the first insulating pattern may be disposed on the buffer layer.

The display panel may further include a light emitting element disposed on the first connection electrode and the second connection electrode. The light emitting element may include a first electrode electrically connected to the transistor via the first connection electrode, a light emitting layer, and a second electrode. The first electrode may be electrically connected to the transistor via the first connection electrode.

At least one of the source area and the drain area may be provided with a hole defined therethrough to be adjacent to the first portion.

Embodiments of the inventive concept provide a method of manufacturing a display panel. The manufacturing method may include providing a base substrate on which conductive patterns and a preliminary semiconductor pattern may be formed on, forming a gate insulating layer on the preliminary semiconductor pattern, forming contact holes through the gate insulating layer, and forming a connection electrode and a gate electrode on the gate insulating layer. A first portion of the gate insulating layer disposed adjacent to the contact holes and a second portion of the gate insulating layer extending from the first portion may be formed through the forming of the contact holes, and a thickness of the first portion may be equal to or smaller than about 50% of a thickness of the second portion.

The forming of the contact holes may include forming a photoresist layer provided with openings defined therethrough on the gate insulating layer, first etching the gate insulating layer to form the contact holes through the gate insulating layer to overlap the openings, ashing the photoresist layer to expand a size of each of the openings such that a portion of an upper surface of the gate insulating layer adjacent to the contact holes is exposed, and second etching the gate insulating layer to form the first portion of the gate insulating layer by partially etching the gate insulating layer.

Each of the first etching and the second etching may be performed by a dry etching process.

The first etching may be performed using a gas including tetrafluoromethane ($CF_4$) and argon (Ar).

The second etching may be performed using a gas including nitrogen trifluoride ($NF_3$) and oxygen ($O_2$).

The ashing may be performed using a gas including oxygen ($O_2$).

According to the above, as the gate insulating pattern layer having a thin thickness is formed on a predetermined area of the semiconductor pattern in the manufacturing method of the display panel, blocking of a current path in the source and drain areas overlapping the gate insulating pattern layer and increasing of a resistance in the source and drain areas are prevented.

According to the above, the circuit layer with improved reliability is manufactured through a simplified process in the method of manufacturing the display panel.

BRIEF DESCRIPTION OF THE DRAWINGS

The above and other advantages of the present disclosure will become readily apparent by reference to the following detailed description when considered in conjunction with the accompanying drawings wherein:

FIG. 9 is a cross-sectional view of a display panel according to an embodiment of the present disclosure.

DETAILED DESCRIPTION

Figure 1:
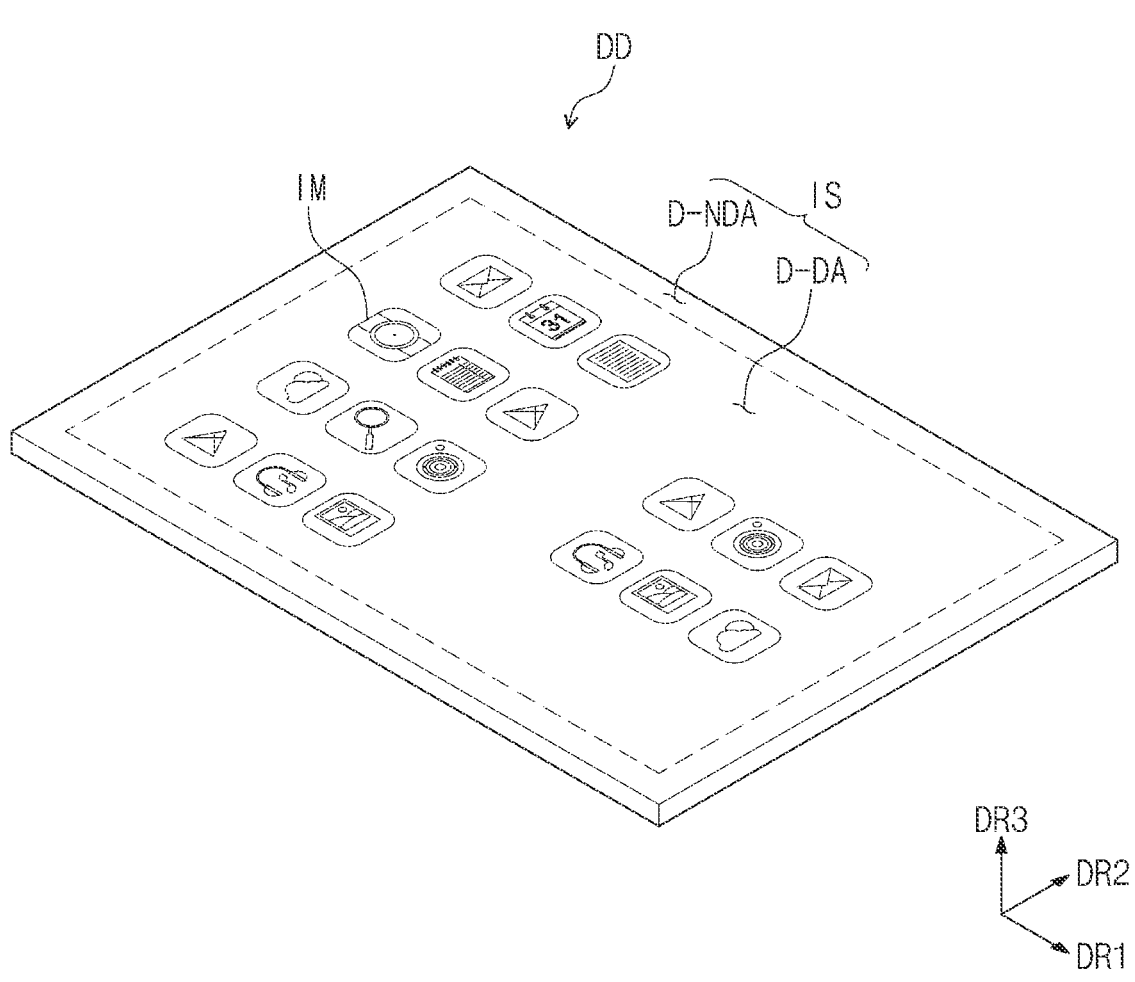
FIG. 1 is a perspective view of a display device according to an embodiment of the present disclosure.

The present disclosure may be variously modified and realized in many different forms, and thus specific embodiments will be exemplified in the drawings and described in detail hereinbelow. However, the present disclosure should not be limited to the specific disclosed forms, and be construed to include all modifications, equivalents, or replacements included in the spirit and scope of the present disclosure.

In the present disclosure, it will be understood that when an element (or area, layer, or portion) is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components are exaggerated for effective description of the technical content. As used herein, the term "and/or" may include any and all combinations of one or more of the associated listed items.

It will be understood that, although the terms first, second, etc. may be used herein to describe various elements, these elements should not be limited by these terms. These terms are only used to distinguish one element from another element. Thus, a first element discussed below could be termed a second element without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another elements or features as shown in the figures.

It will be further understood that the terms "include" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the present disclosure will be described with reference to accompanying drawings.

FIG. 1 is a perspective view of a display device DD according to an embodiment of the present disclosure.

The display device DD may be activated in response to electrical signals and may display an image IM. The display device DD may include various embodiments to provide the image IM to a user. As an example, the display device DD may be applied to a large-sized electronic device, such as a television set, an outdoor billboard, etc., and a small and medium-sized electronic device, such as a monitor, a mobile phone, a tablet computer, a navigation unit, a game unit, etc. However, these are merely examples, and the display device DD may be applied to other electronic devices as long as they do not depart from the concept of the present disclosure.

Referring to FIG. 1, the display device DD may have a rectangular shape with long sides extending in a first direction DR1 and short sides extending in a second direction DR2 crossing the first direction DR1. However, the shape of the display device DD should not be limited to the rectangular shape, and the display device DD may have a variety of shapes, such as a circular shape, a polygonal shape, etc.

The display device DD may display the image IM through a display surface IS toward a third direction DR3, which is substantially perpendicular to a plane defined by the first direction DR1 and the second direction DR2. A normal line direction of the display surface IS may be substantially parallel to the third direction DR3. The display surface IS through which the image IM is displayed may correspond to a front surface of the display device DD. The image IM may include a still image as well as a video. FIG. 1 shows application icons as a representative example of the image IM.

In the present embodiment, front (or upper) and rear (or lower) surfaces of each member (or each unit) of the display device DD may be defined with respect to the third direction DR3. The front and rear surfaces are opposite to each other in the third direction DR3, and a normal line direction of each of the front and rear surfaces may be substantially parallel to the third direction DR3. A distance between the front and rear surfaces of each constituent (or each unit) in the third direction DR3 may correspond to a thickness of the constituent (or the unit).

In the present disclosure, the expression "when viewed in a plane (or in a plan view)" may mean a state of being viewed in the third direction DR3. In the present disclosure, the expression "when viewed in a cross-section" may mean a state of being viewed in the first direction DR1 or the second direction DR2. Meanwhile, directions indicated by the first, second, and third directions DR1, DR2, and DR3 are relative to each other, and thus, the directions indicated by the first, second, and third directions DR1, DR2, and DR3 may be changed to other directions.

FIG. 1 shows the display device DD including a flat display surface IS as a representative example. However, the shape of the display surface IS of the display device DD should not be limited thereto or thereby, and the display surface IS may have a curved or three-dimensional shape.

The display device DD may be flexible. The term "flexible" used herein refers to the property of being able to be bent from a structure that is completely bent to a structure that is bent at the scale of a few nanometers. For example, the display device DD may be a curved display device or a foldable display device. According to an embodiment, the display device DD may be rigid.

The display surface IS of the display device DD may include a display part D-DA and a non-display part D-NDA. The display part D-DA may be a part where the image IM is displayed within the front surface of the display device DD, and a user may view the image IM through the display part D-DA. In the present embodiment, the display part D-DA having a quadrangular shape in a plan view is illustrated as a representative example, however, the display part D-DA may have a variety of shapes depending on a design of the display device DD.

The non-display part D-NDA may be a part where the image IM is not displayed within the front surface of the display device DD. The non-display part D-NDA may have a color (e.g., a predetermined color) and may block a light. The non-display part D-NDA may be disposed adjacent to the display part D-DA. As an example, the non-display part D-NDA may be disposed outside of the display part D-DA and may surround the display part D-DA, however, this is merely an example. The non-display part D-NDA may be defined adjacent to only one side of the display part D-DA or may be defined in a side surface rather than the front surface of the display device DD. According to an embodiment, the non-display part D-NDA may be omitted.

According to an embodiment, the display device DD may sense an external input applied thereto from the outside. The external input may include a variety of external inputs provided from the outside, such as pressure, temperature, light, etc. The external input may include a proximity input (e.g., a hovering input) applied when approaching close to or adjacent to the display device DD at a predetermined distance as well as a touch input (e.g., a touch by a hand of a user or a touch by a pen).

Figure 2A:
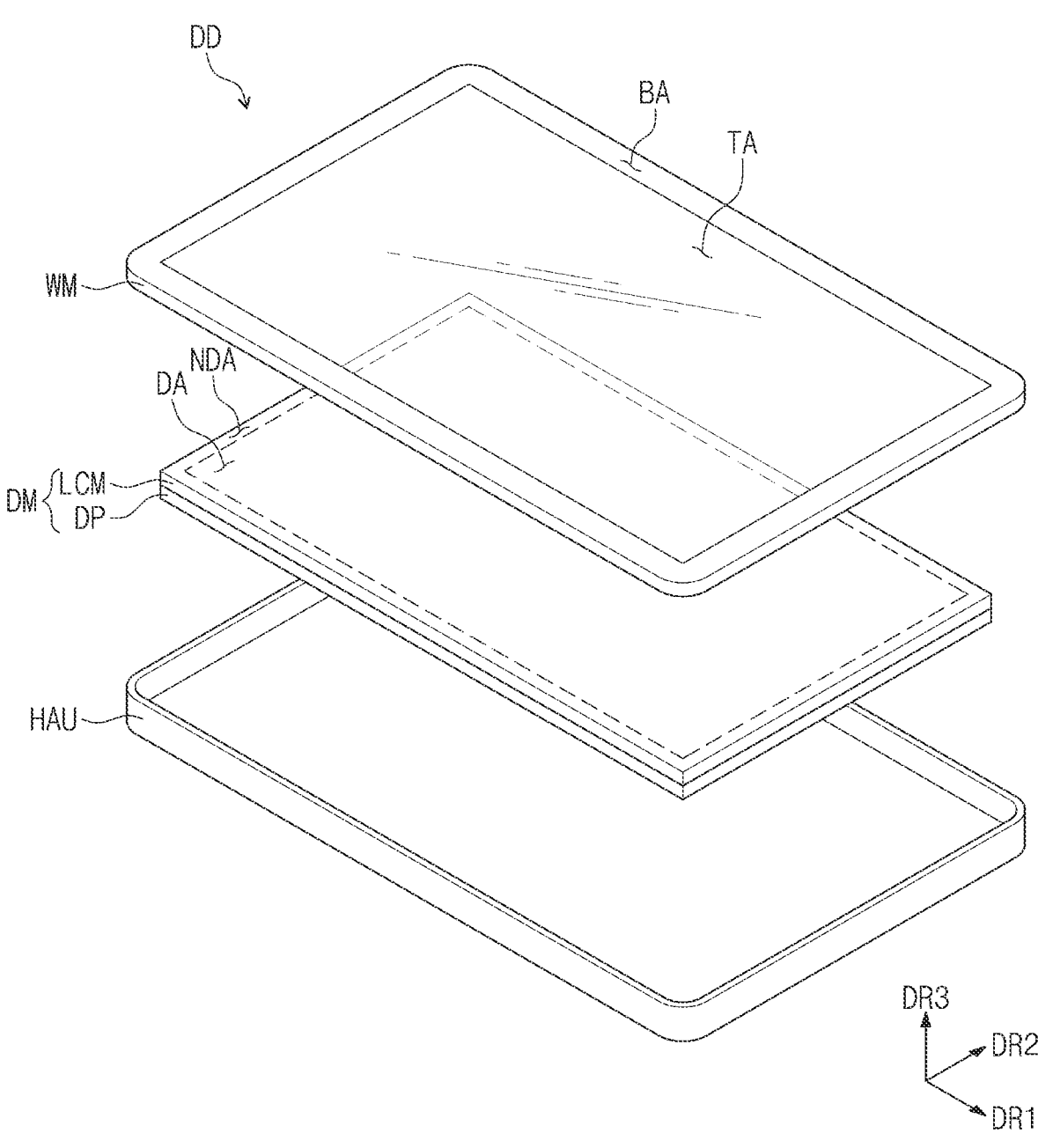
FIG. 2A is an exploded perspective view of a display device according to an embodiment of the present disclosure.
Figure 2B:
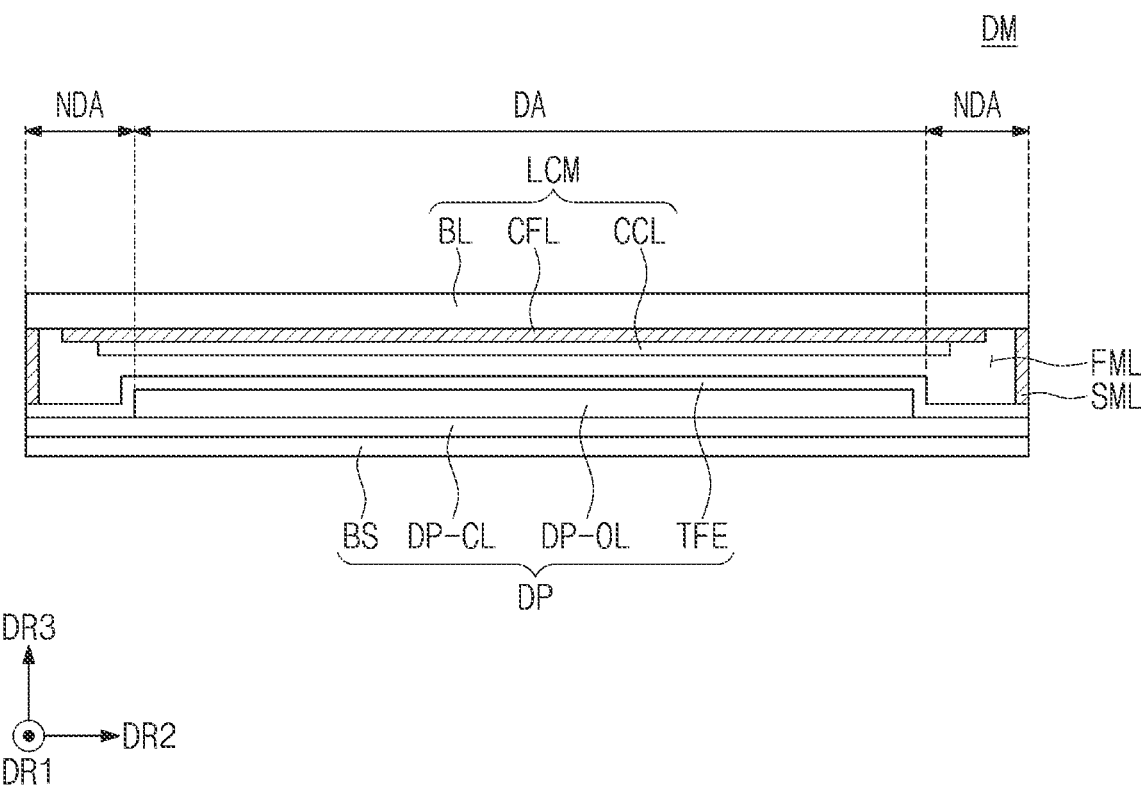
FIG. 2B is a cross-sectional view of a display module according to an embodiment of the present disclosure.

FIG. 2A is an exploded perspective view of the display device DD according to an embodiment of the present disclosure, and FIG. 2B is a cross-sectional view of a display module DM according to an embodiment of the present disclosure.

Referring to FIGS. 2A and 2B, the display device DD may include a window WM, the display module DM, and a housing HAU. The display module DM may include a display panel DP and a light control member LCM disposed on the display panel DP.

The window WM may be coupled with the housing HAU to form an external appearance of the display device DD and to provide an inner space in which components, (e.g., the display module DM), of the display device DD are accommodated.

The window WM may be disposed on the display module DM. The window WM may protect the display module DM from external impacts. A front surface of the window WM may correspond to the display surface IS of the display device DD. The front surface of the window WM may include a transmission area TA and a bezel area BA.

The transmission area TA of the window WM may be an optically transparent area. The window WM may transmit the image provided from the display module DM through the transmission area TA, and the user may view the image. The transmission area TA of the window WM may correspond to the display part D-DA of the display device DD.

The window WM may include an optically transparent insulating material. As an example, the window WM may include a glass, sapphire, or plastic material. The window WM may have a single-layer or multi-layer structure. The window WM may further include functional layers, such as an anti-fingerprint layer, a phase control layer, a hard coating layer, etc., disposed on an optically transparent substrate.

The bezel area BA of the window WM may be obtained by depositing, coating, or printing a material having a color (e.g., a predetermined color) on the optically transparent substrate. The bezel area BA of the window WM may prevent components of the display module DM which are disposed to overlap the bezel area BA from being viewed from the outside. The bezel area BA may correspond to the non-display part D-NDA (refer to FIG. 1) of the display device DD.

The display module DM may be disposed between the window WM and the housing HAU. The display module DM may display the image in response to electrical signals. The display module DM may include a display area DA and a non-display area NDA adjacent to the display area DA.

The display area DA may be activated in response to electrical signals. The display area DA may be an area from which the image provided from the display panel DP exits. The display area DA of the display module DM may overlap the transmission area TA of the window WM. In the present disclosure, the expression "an area/portion overlaps another area/portion" should not be limited to meaning that "an area/portion has the same size and/or the same shape as those of another area/portion". The image provided from the display area DA may be viewed from the outside through the transmission area TA.

The non-display area NDA may be defined adjacent to the display area DA. As an example, the non-display area NDA may surround the display area DA, however, it should not be limited thereto or thereby. According to an embodiment, the non-display area NDA may be defined in a variety of shapes. A driving circuit or a driving line to drive elements disposed in the display area DA, various signal lines to provide electrical signals to the elements, and pads may be disposed in the non-display area NDA. The non-display area NDA of the display module DM may overlap at least a portion of the bezel area BA of the window WM, and components of the display module DM which are disposed in the non-display area NDA may be prevented from being viewed from the outside by the bezel area BA.

The display panel DP according to an embodiment may be a light-emitting type display panel, however, it should not be particularly limited thereto. For instance, the display panel DP may be an organic light emitting display panel, an inorganic light emitting display panel, or a quantum dot light emitting display panel. A light emitting layer of the organic light emitting display panel may include an organic light emitting material. A light emitting layer of the inorganic light emitting display panel may include an inorganic light emitting material. A light emitting layer of the quantum dot light emitting display panel may include a quantum dot and/or a quantum rod. Hereinafter, the organic light emitting display panel will be described as a representative example of the display panel DP.

The display panel DP may include a base substrate BS, a circuit layer DP-CL, a display element layer DP-OL, and an encapsulation layer TFE.

The base substrate BS may provide a base surface on which the circuit layer DP-CL is disposed. The base substrate BS may be a rigid substrate or a flexible substrate.

The circuit layer DP-CL may be disposed on the base substrate BS. The circuit layer DP-CL may include driving elements such as transistors, signal lines, and signal pads. The display element layer DP-OL may include light emitting elements disposed to overlap the display area DA. The light emitting elements of the display element layer DP-OL may be electrically connected to the driving elements of the circuit layer DP-CL and may emit light through the display area DA in response to a signal from the driving elements.

The encapsulation layer TFE may be disposed on the display element layer DP-OL and may encapsulate the light emitting elements. The encapsulation layer TFE may include a plurality of thin layers. The thin layers of the encapsulation layer TFE may improve an optical efficiency of the light emitting elements or may protect the light emitting elements.

The light control member LCM may be disposed on the display panel DP. The light control member LCM may be coupled to the display panel DP by a coupling process using a sealing member SML.

However, according to an embodiment, the light control member LCM may be disposed directly on the display panel DP. In the present disclosure, a structure in which one layer, component, member, or the like is formed on another layer, component, member, or the like through successive processes without using a separate adhesive layer or adhesive member will be referred to as "being directly disposed". As an example, the expression "the light control member LCM is disposed directly on the display panel DP" means that the light control member LCM is formed on a base surface of the display panel DP through successive processes without employing a separate adhesive layer after the display panel DP is formed.

The light control member LCM may selectively convert a wavelength of a light, i.e., a source light, provided from the display panel DP or may selectively transmit the source light. As an example, the light control member LCM may include light conversion patterns that convert an optical property of the source light provided from the display panel DP. The light control member LCM may control a color purity or a color reproducibility of the light exiting from the display device DD and may prevent the external light incident thereinto from the outside of the display device DD from being reflected.

The light control member LCM may include a base layer BL, a color filter layer CFL, and a light control layer CCL. The base layer BL may be disposed to face the base substrate BS of the display panel DP, and the color filter layer CFL and the light control layer CCL, which are disposed on the base layer BL, may be disposed between the display panel DP and the base layer BL.

The light control layer CCL may include a quantum dot that converts a wavelength of the source light provided from the display panel DP or may further include a transmission portion that transmits the source light. The source light passing through and exiting from the quantum dot included in the light control layer CCL may be light having a color different from that of the source light.

The color filter layer CFL may include color filters, and the color filters may transmit or absorb light passing through and exiting from the light control layer CCL according to their colors. The color filter layer CFL may absorb light that are not converted by the light control layer CCL and thus may prevent a color purity of the display device DD from being lowered. In addition, the color filter layer CFL may filter the external light to have the same color as the pixels and may reduce the reflection of the external light.

The sealing member SML may be disposed in the non-display area NDA that is an outer area of the display module DM and may prevent a foreign substance, oxygen, and moisture from entering the display module DM from the outside of the display module DM. The sealing member SML may be formed of a sealant containing a curable resin.

The display module DM may further include a filling layer FML disposed between the display panel DP and the light control member LCM. The filling layer FML may fill a space disposed between the display panel DP and the light control member LCM. The filling layer FML may function as a buffer between the display panel DP and the light control member LCM. According to an embodiment, the filling layer FML may have an impact absorbing function and may increase a strength of the display module DM.

The filling layer FML may be formed of a filling resin including a polymer resin. As an example, the filling layer FML may include an acrylic-based resin or an epoxy-based resin. However, according to an embodiment, the light control member LCM may be disposed directly on the display panel DP, and the filling layer FML and the sealing member SML may be omitted. In the case where the light control member LCM is disposed directly on the display panel DP, the base layer BL of the light control member LCM may be omitted.

The housing HAU may be disposed under the display module DM and may accommodate the display module DM. The housing HAU may absorb impacts applied to the display module DM from the outside and may prevent a foreign substance and moisture from entering into the display module DM, and thus, the display module DM may be protected by the housing HAU. According to an embodiment, the housing HAU may be obtained by coupling a plurality of accommodating members.

Meanwhile, the display device DD may further include an input sensing module. The input sensing module may obtain coordinate information of the external input applied thereto from the outside of the display device DD. The input sensing module of the display device DD may be driven in various ways, such as a capacitive method, a resistive method, an infrared ray method, a pressure method, or the like, however, it should not be particularly limited.

The input sensing module may be disposed on the display module DM. The input sensing module may be disposed directly on the display module DM through successive processes or may be attached to the display module DM by an adhesive layer after being manufactured separately from the display module DM. According to an embodiment, the input sensing module may be disposed between components of the display module DM. As an example, the input sensing module may be disposed between the display panel DP and the light control member LCM.

Figure 3:
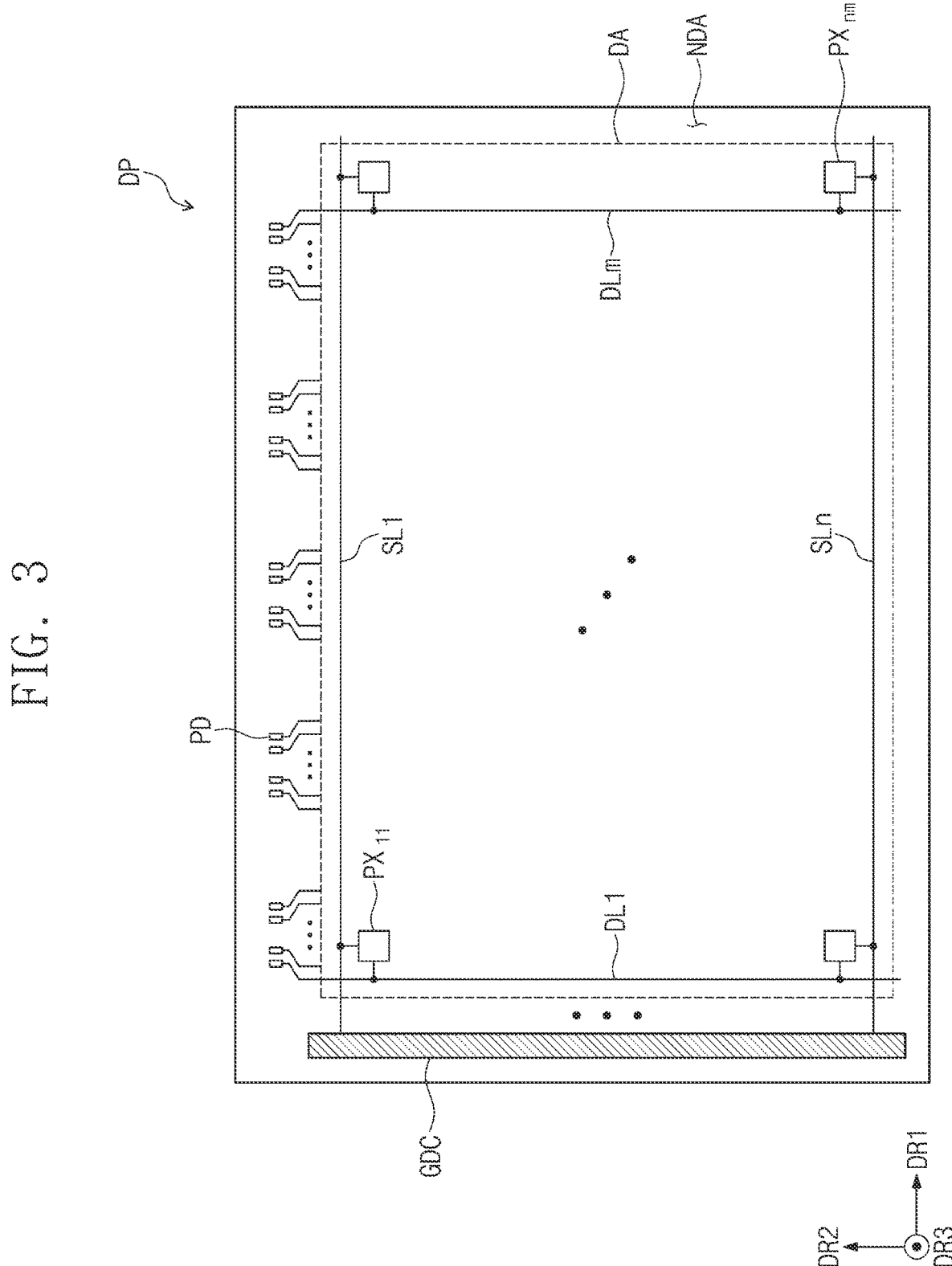
FIG. 3 is a plan view of a display panel according to an embodiment of the present disclosure.

FIG. 3 is a plan view of the display panel DP according to an embodiment of the present disclosure.

Referring to FIG. 3, the display panel DP may include pixels PX11 to PXnm disposed in the display area DA and signal lines SL1 to SLn and DL1 to DLm electrically connected to the pixels PX11 to PXnm. The display panel DP may include a driving circuit GDC and pads PD which are disposed in the non-display area NDA.

Each of the pixels PX11 to PXnm may include the light emitting element and a pixel driving circuit connected to the light emitting element and including a plurality of transistors (e.g., a switching transistor, a driving transistor, etc.) and a capacitor. Each of the pixels PX11 to PXnm may emit light in response to an electrical signal applied thereto. FIG. 3 shows the pixels PX11 to PXnm arranged in a matrix form as a representative example, however, the arrangement of the pixels PX11 to PXnm should not be limited thereto or thereby.

The signal lines SL1 to SLn and DL1 to DLm may include scan lines SL1 to SLn and data lines DL1 to DLm. Each of the pixels PX11 to PXnm may be connected to a corresponding scan line of the scan lines SL1 to SLn and a corresponding data line of the data lines DL1 to DLm. Meanwhile, more types of signal lines may be provided in the display panel DP depending on the configuration of the pixel driving circuit of the pixels PX11 to PXnm.

The driving circuit GDC may include a gate driving circuit. The gate driving circuit may generate gate signals and may sequentially output the gate signals to the scan lines SL1 to SLn. The gate driving circuit may further output another control signal to the pixel driving circuit of the pixels PX11 to PXnm.

The driving circuit GDC and the pixels PX11 to PXnm may include a plurality of transistors formed through a process, for instance, a low temperature polycrystalline silicon (LTPS) process, a low temperature polycrystalline oxide (LTPO) process, or an oxide semiconductor process.

The pads PD may be arranged in the non-display area NDA along one direction. The pads PD may be connected to a circuit board. Each of the pads PD may be electrically connected to a corresponding signal line among the signal lines SL1 to SLn and DL1 to DLm and may be electrically connected to corresponding pixels among the pixels PX11 to PXnm via the signal line. The pads PD may be provided integrally with the signal lines SL1 to SLn and DL1 to DLm, however, they should not be limited thereto or thereby. According to an embodiment, the pads PD may be disposed on a different layer from the signal lines SL1 to SLn and DL1 to DLm and may be connected to the signal lines SL1 to SLn and DL1 to DLm via a contact hole.

Figure 4:
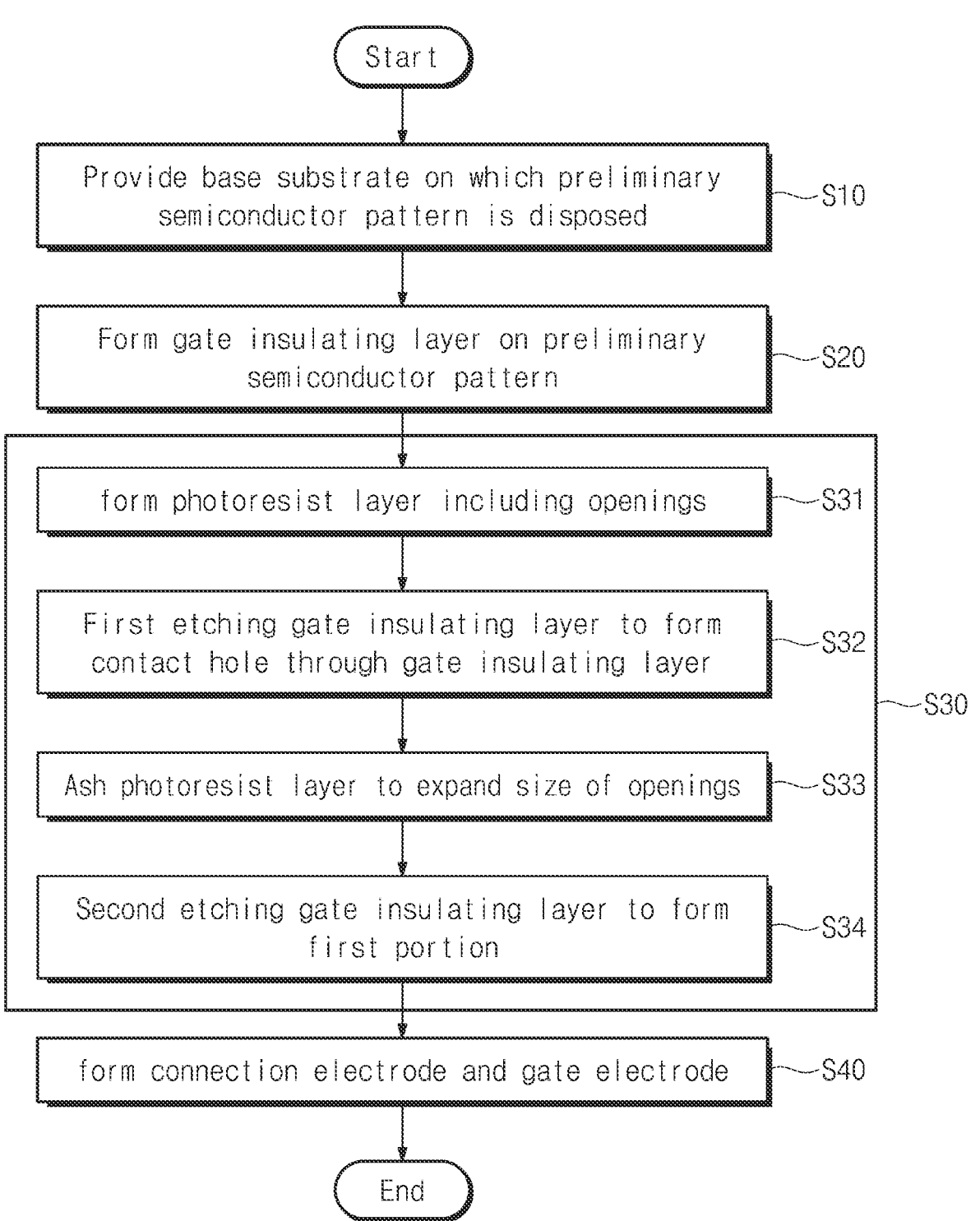
FIG. 4 is a flowchart of a method of manufacturing a display panel according to an embodiment of the present disclosure.

FIG. 4 is a flowchart of a method of manufacturing the display panel according to an embodiment of the present disclosure.

Referring to FIG. 4, the manufacturing method of the display panel may include providing a base substrate on which conductive patterns and a preliminary semiconductor pattern are formed (S10), forming a gate insulating layer on the preliminary semiconductor pattern (S20), forming contact holes through the gate insulating layer (S30), and forming a connection electrode and a gate electrode on the gate insulating layer through which the contact holes are formed (S40).

The forming of the contact holes through the gate insulating layer (S30) may include forming a photoresist layer with openings defined therethrough on the gate insulating layer (S31), first etching the gate insulating layer to form the contact holes through the gate insulating layer and the buffer layer to correspond to the openings (S32), ashing the photoresist layer to expand the openings (S33), and second etching a portion of the gate insulating layer exposed through the expanded openings to form a first portion (S34). Each process will be described in detail later with reference to drawings.

Figure 5A:
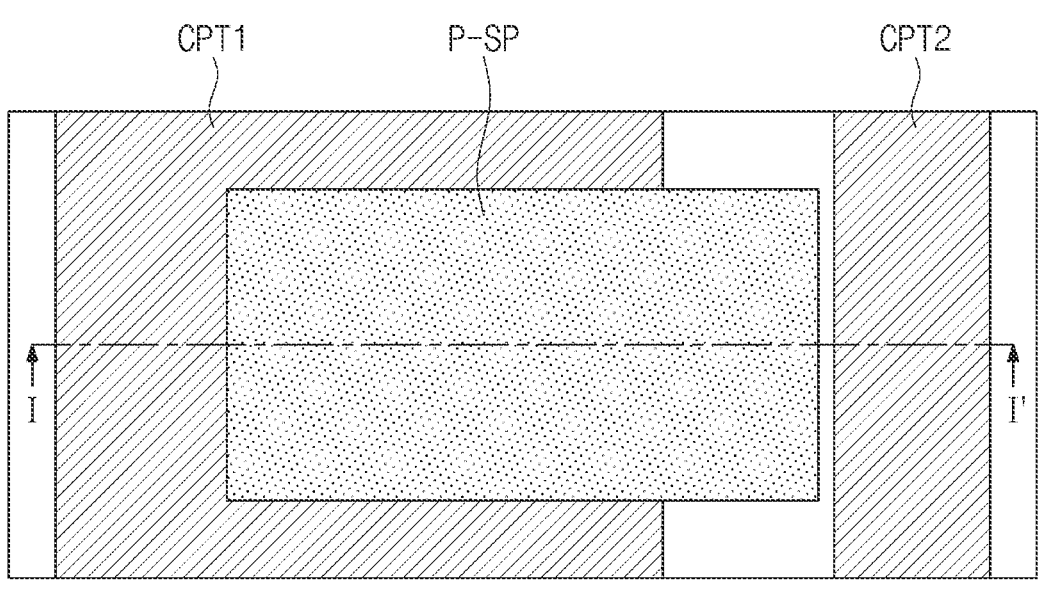
FIG. 5A is a plan view of a process of a manufacturing method of a display panel according to an embodiment of the present disclosure.
Figure 5A:
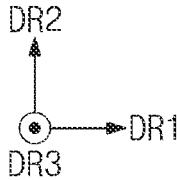
Figure 5B:
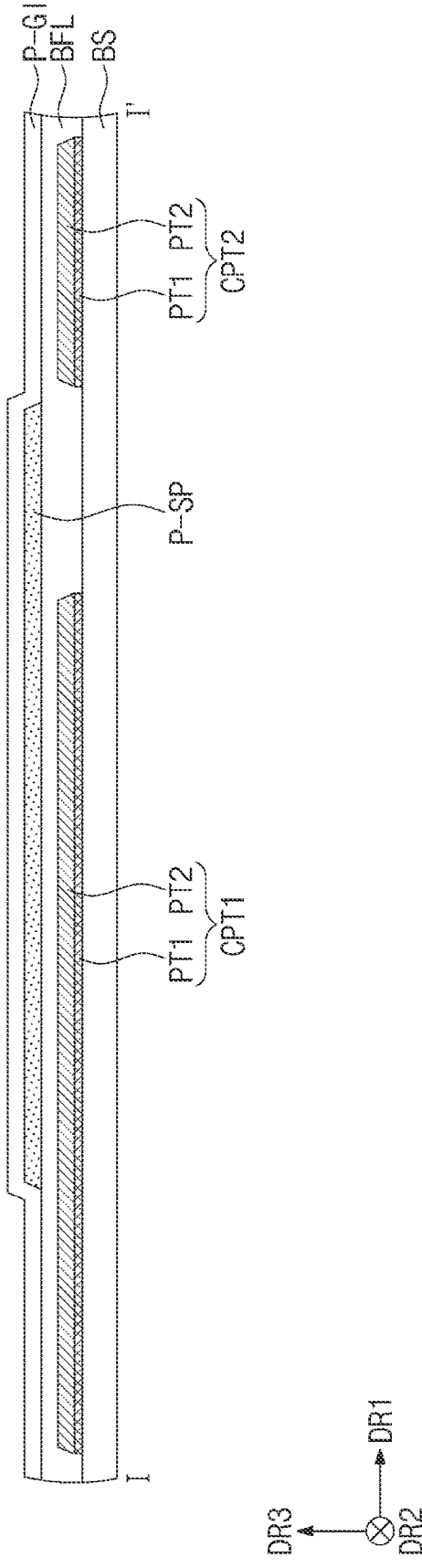
FIG. 5B is a cross-sectional view taken along a line I-I' of FIG. 5A.

FIG. 5A is a plan view of a process of a manufacturing method of the display panel according to an embodiment of the present disclosure, and FIG. 5B is a cross-sectional view taken along a line I-I' of FIG. 5A. FIGS. 5A and 5B show the base substrate BS and a first conductive pattern CPT1 and a second conductive pattern CPT2 formed on the base substrate BS (S10, refer to FIG. 4) and the gate insulating layer formed on the first conductive pattern CPT1 and the second conductive pattern CPT2 (S20, refer to FIG. 4).

Referring to FIGS. 5A and 5B, the base substrate BS may provide a base surface on which the circuit layer DP-CL (refer to FIG. 2B) is disposed. The base substrate BS may include a glass substrate, a metal substrate, a polymer substrate, or an organic/inorganic composite material substrate. The base substrate BS may have a single-layer or multi-layer structure. As an example, the base substrate BS having the multi-layer structure may include synthetic resin layers and at least one inorganic layer disposed between the synthetic resin layers.

The synthetic resin layer included in the base substrate BS may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, a perylene-based resin, and a polyimide-based resin, however, the material for the synthetic resin layer of the base substrate BS should not be limited thereto or thereby.

Meanwhile, a support substrate may be further disposed under the base substrate BS to prevent the base substrate BS from being damaged in the manufacturing process of the display panel, and the support substrate may be removed in subsequent processes.

A first conductive pattern CPT1 and a second conductive pattern CPT2 may be formed on the base substrate BS. The first conductive pattern CPT1 and the second conductive pattern CPT2 may be formed on the same layer and may be spaced apart from each other in a plan view. The first conductive pattern CPT1 and the second conductive pattern CPT2 may be substantially simultaneously formed through the same process. As an example, the first conductive pattern CPT1 and the second conductive pattern CPT2 may be formed to be spaced apart from each other by depositing a conductive layer on the base substrate BS and patterning the conductive layer.

Each of the first conductive pattern CPT1 and the second conductive pattern CPT2 may have a multi-layer structure. The first conductive pattern CPT1 and the second conductive pattern CPT2 may be formed of the same material and may have the same stack structure. As an example, each of the first conductive pattern CPT1 and the second conductive pattern CPT2 may include a first pattern portion PT1 and a second pattern portion PT2 which are stacked on the base substrate BS along a thickness direction, however, the present disclosure should not be limited thereto or thereby. According to an embodiment, each of the first and second conductive patterns CPT1 and CPT2 may have a single-layer structure or may have a multi-layer structure in which the number of stacked pattern portions is greater than the number of pattern portions shown in FIG. 5B.

The first pattern portion PT1 and the second pattern portion PT2 may have different thicknesses from each other. As an example, the thickness of the first pattern portion PT1 may be smaller than the thickness of the second pattern portion PT2, however, the present disclosure should not be limited thereto or thereby.

Each of the first pattern portion PT1 and the second pattern portion PT2 may include one of molybdenum (Mo), aluminum (Al), chromium (Cr), gold (Au), titanium (Ti), nickel (Ni), neodymium (Nd), and copper (Cu) or an alloy thereof. As an example, the first pattern portion PT1 may include titanium (Ti), and the second pattern portion PT2 may include copper (Cu), however, the present disclosure should not be limited thereto or thereby.

After the first conductive pattern CPT1 and the second conductive pattern CPT2 are formed, a buffer layer BFL may be disposed on the first conductive pattern CPT1 and the second conductive pattern CPT2. The buffer layer BFL may be formed by a deposition process such as a chemical vapor deposition method. The buffer layer BFL may include at least one inorganic layer. As an example, the buffer layer BFL may include at least one of aluminum oxide, titanium oxide, silicon oxide, silicon nitride, silicon oxynitride, zirconium oxide, and hafnium oxide.

The preliminary semiconductor pattern P-SP may be formed on the buffer layer BFL. The buffer layer BFL may be an adhesion enhancement layer which increases adhesion strength between the preliminary semiconductor pattern P-SP and a layer disposed thereunder, the buffer layer BFL.

The preliminary semiconductor pattern P-SP may include metal oxide. As an example, the preliminary semiconductor pattern P-SP may include a metal oxide of metals, such as zinc (Zn), indium (In), gallium (Ga), tin (Sn), titanium (Ti), etc., or a mixture of the metal, such as zinc (Zn), indium (In), gallium (Ga), tin (Sn), titanium (Ti), etc., and oxides thereof. The oxide semiconductor may include indium-tin oxide (ITO), indium-gallium-zinc oxide (IGZO), zinc oxide (ZnO), indium-zinc oxide (IZO), zinc-indium oxide (ZIO), indium oxide (InO), titanium oxide (TiO), indium-zinc-tin oxide (IZTO), zinc-tin oxide (ZTO), or the like. However, the present disclosure should not be limited thereto or thereby, and the preliminary semiconductor pattern P-SP may include a polycrystalline silicon or an amorphous silicon.

The preliminary semiconductor pattern P-SP may be formed by depositing a layer including a material, such as metal oxide, polysilicon, etc., on the buffer layer BFL and patterning the layer. At least a portion of the preliminary semiconductor pattern P-SP may overlap the first conductive pattern CPT1 in a plan view.

The gate insulating layer P-GI may be disposed on the preliminary semiconductor pattern P-SP. The gate insulating layer P-GI may be formed through a deposition process. The gate insulating layer P-GI may include at least one inorganic layer. As an example, the gate insulating layer P-GI may include at least one of aluminum oxide, titanium oxide, silicon oxide, silicon nitride, silicon oxynitride, zirconium oxide, and hafnium oxide.

According to an embodiment, the buffer layer BFL and the gate insulating layer P-GI may include the same material as each other. As an example, each of the buffer layer BFL and the gate insulating layer P-GI may include silicon oxide. The buffer layer BFL and the gate insulating layer P-GI may include the same material, but may be formed under different deposition conditions. According to an embodiment, the buffer layer BFL and the gate insulating layer P-GI may include the same material and may be formed under the same deposition conditions, or the buffer layer BFL and the gate insulating layer P-GI may include different materials from each other.

Figure 6A:
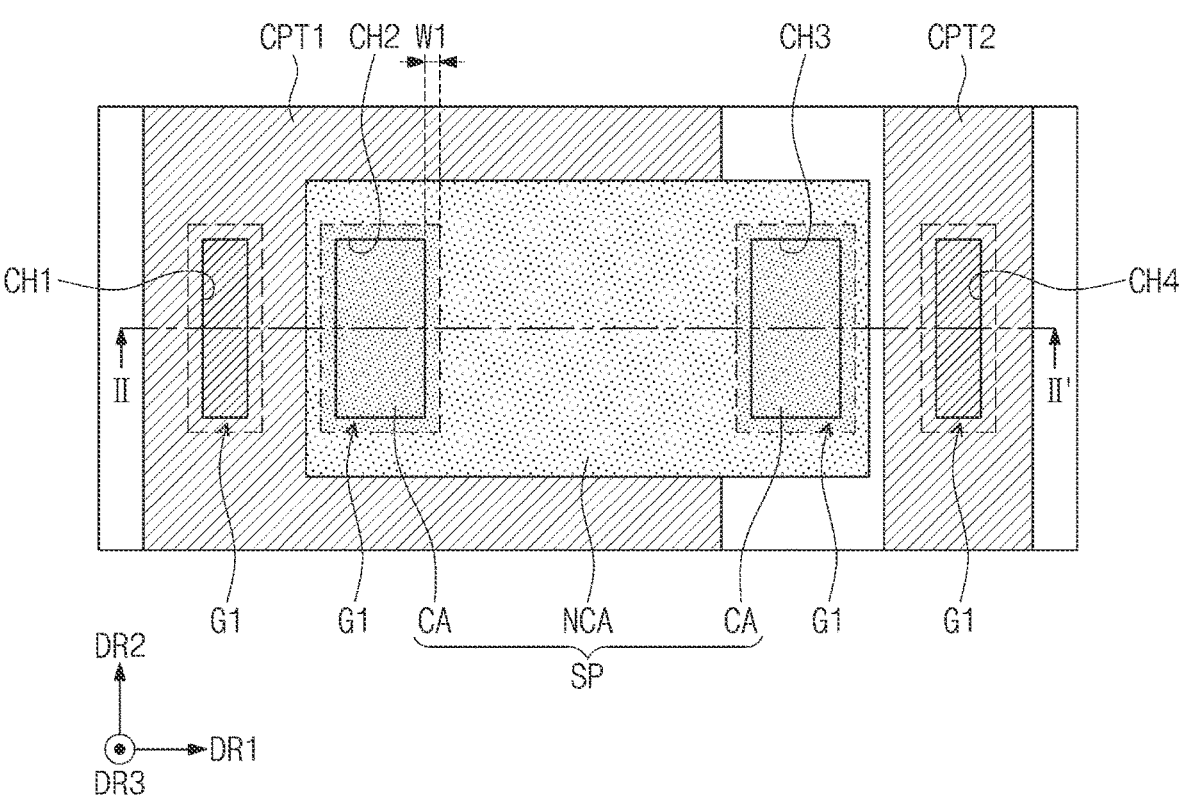
FIG. 6A is a plan view of a process of a manufacturing method of a display panel according to an embodiment of the present disclosure.

FIG. 6A is a plan view of a process of a manufacturing method of the display panel according to an embodiment of the present disclosure. FIGS. 6B to 6E are cross-sectional views sequentially showing processes to manufacture the display panel shown in FIG. 6A. That is, the display panel shown in FIG. 6A may be formed through the processes shown in FIGS. 6B to 6E, and FIG. 6E is a cross-sectional view taken along a line II-II' of FIG. 6A. FIGS. 6A to 6E show the forming of the contact holes through the gate insulating layer (S30, refer to FIG. 4).

Figure 6B:
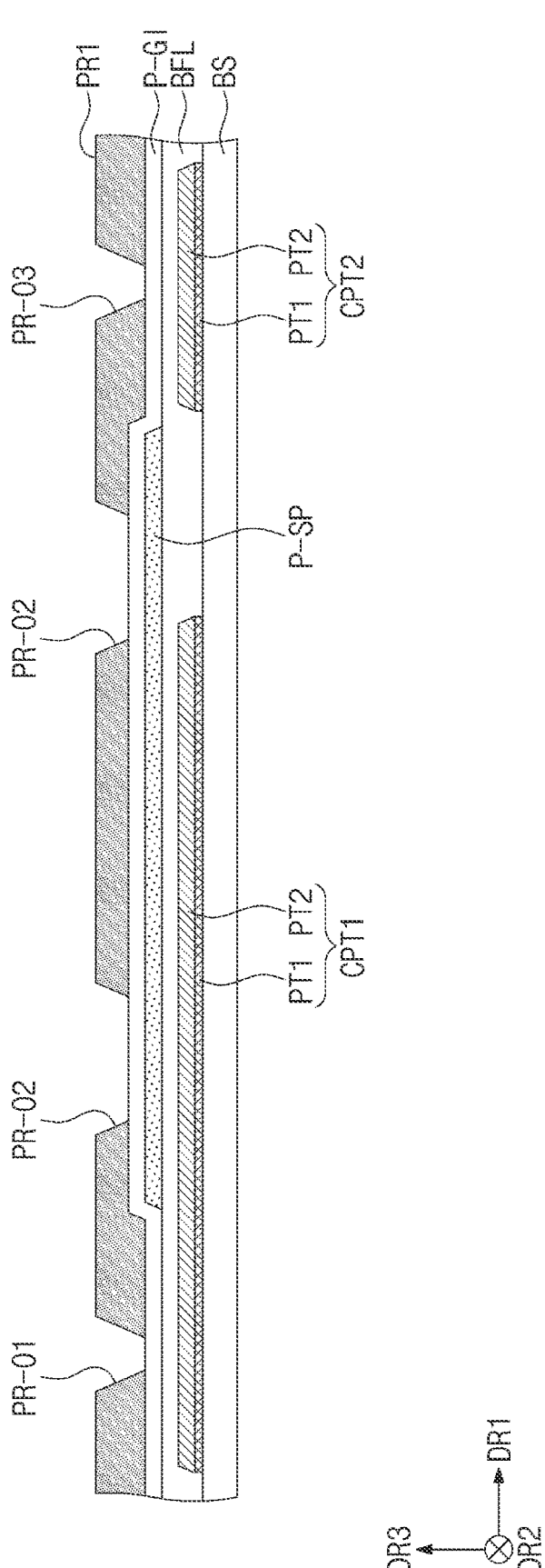
FIGS. 6B to 6E are cross-sectional views of processes of a manufacturing method of a display panel according to an embodiment of the present disclosure.

Referring to FIG. 6B, a first photoresist layer PR1 may be formed on the gate insulating layer P-GI. The first photoresist layer PR1 may be patterned through a patterning process, and thus, a plurality of openings PR-O1, PR-O2, and PR-O3 may be formed through the first photoresist layer PR1. Portions of an upper surface of the gate insulating layer P-GI disposed under the first photoresist layer PR1 may be exposed through the openings PR-O1, PR-O2, and PR-O3.

The openings PR-O1, PR-O2, and PR-O3 may include first, second, and third openings PR-O1, PR-O2, and PR-O3. The first opening PR-O1 may overlap the first conductive pattern CPT1 in a plan view. The second opening PR-O2 may be provided in plural, and each of the second openings PR-O2 may overlap the preliminary semiconductor pattern P-SP in a plan view. The third opening PR-O3 may overlap the second conductive pattern CPT2 in a plan view. Meanwhile, one first opening PR-O1 and one third opening PR-O3 are shown as a representative example, however, each of the first opening PR-O1 and the third opening PR-O3 may be provided in plural in one first photoresist layer PR1, and the first openings PR-O1 and the third openings PR-O3 may be arranged in a predetermined arrangement.

Figure 6C:
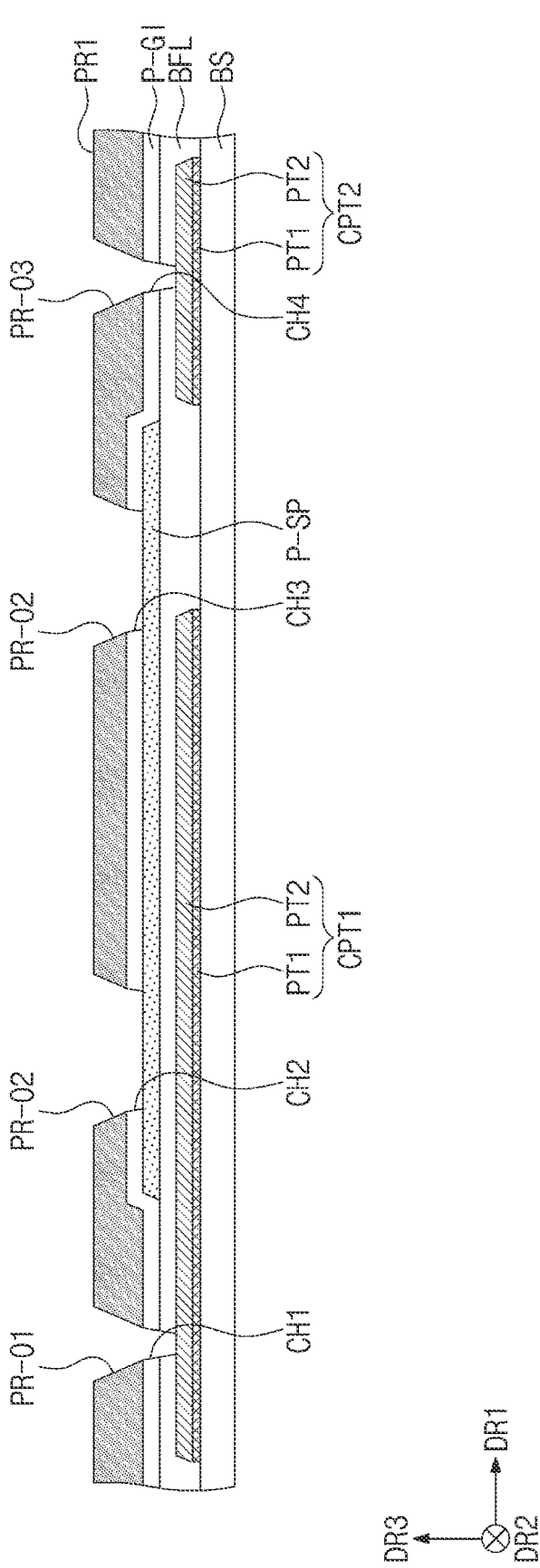

Referring to FIGS. 6B and 6C, after the first photoresist layer PR1 is patterned, the buffer layer BFL and the gate insulating layer P-GI may be etched to form contact holes CH1, CH2, CH3, and CH4 corresponding to the openings PR-O1, PR-O2, and PR-O3 through the buffer layer BFL and the gate insulating layer P-GI. This etching process may correspond to the first etching (S32, refer to FIG. 4).

According to an embodiment, the buffer layer BFL and the gate insulating layer P-GI may be etched through a dry etching process with anisotropic properties. A gas used to etch the buffer layer BFL and the gate insulating layer P-GI may include a chloride-fluoride (CF) based compound, such as tetrafluoromethane ($CF_4$), and argon (Ar). Accordingly, an upper surface of the preliminary semiconductor pattern P-SP exposed by the contact holes CH2 and CH3 and an upper surface of the first conductive pattern CPT1 and the second conductive pattern CPT2 exposed by the contact holes CH1 and CH4 may be prevented from being etched together with the gate insulating layer P-GI and the buffer layer BFL or damaged. However, the gas used for the etching process should not be particularly limited as long as the buffer layer BFL and the gate insulating layer P-GI are selectively etched.

A first contact hole CH1 may be formed through the buffer layer BFL and the gate insulating layer P-GI to correspond to the first opening PR-O1 of the first photoresist layer PR1. The first contact hole CH1 may overlap the first conductive pattern CPT1 in a plan view, and a portion of an upper surface of the first conductive pattern CPT1 may be exposed through the first contact hole CH1. That is, a portion of the second pattern portion PT2 of the first conductive pattern CPT1 may be exposed to the outside through the first contact hole CH1.

A second contact hole CH2 may be formed through the gate insulating layer P-GI to correspond to the second opening PR-O2 adjacent to the first opening PR-O1 among the second openings PR-O2 of the first photoresist layer PR1. A portion of the upper surface of the preliminary semiconductor pattern P-SP may be exposed through the second contact hole CH2. The second contact hole CH2 may overlap the preliminary semiconductor pattern P-SP and the first conductive pattern CPT1 in a plan view.

A third contact hole CH3 may be formed through the gate insulating layer P-GI to correspond to the second opening PR-O2 adjacent to the third opening PR-O3 among the second openings PR-O2 of the first photoresist layer PR1. The third contact hole CH3 may be spaced apart from the second contact hole CH2, and another portion of the upper surface of the preliminary semiconductor pattern P-SP may be exposed through the third contact hole CH3.

A fourth contact hole CH4 may be formed through the buffer layer BFL and the gate insulating layer P-GI to correspond to the third opening PR-O3 of the first photoresist layer PR1. The fourth contact hole CH4 may overlap the second conductive pattern CPT2 in a plan view, and a portion of the upper surface of the second conductive pattern CPT2 may be exposed through the fourth contact hole CH4. That is, a portion of the second pattern portion PT2 of the second conductive pattern CPT2 may be exposed through the fourth contact hole CH4.

Figure 6D:
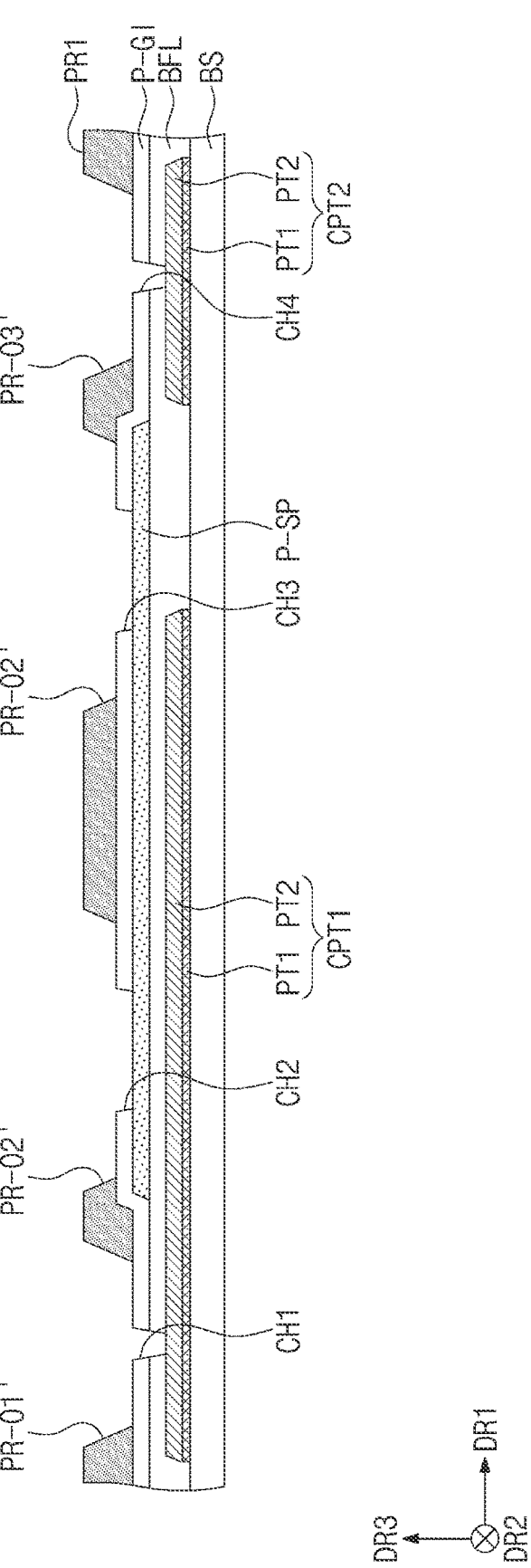

Referring to FIGS. 6C and 6D, after the contact holes CH1, CH2, CH3, and CH4 are formed through the buffer layer BFL and the gate insulating layer P-GI, a portion of the first photoresist layer PR1 may be further removed by an ashing process. That is, a size of the openings PR-O1, PR-O2, and PR-O3 of the first photoresist layer PR1 in a plan view may be expanded by the ashing process. In the present embodiment, the ashing process may be carried out using oxygen ($O_2$), however it should not be limited thereto or thereby.

As the size of the openings PR-O1, PR-O2, and PR-O3 of the first photoresist layer PR1 is expanded in a plan view, the expanded openings PR-O1', PR-O2', and PR-O3' may have a size greater than that of the contact holes CH1, CH2, CH3, and CH4. As an example, the first expanded opening PR-O1' may surround the first contact hole CH1 in a plan view. Similarly, each of the expanded second openings PR-O2' may surround the second contact hole CH2 and the third contact hole CH3 in a plan view, respectively.

As the size of the openings PR-O1, PR-O2, and PR-O3 is expanded in a plan view, inner side surfaces of the first photoresist layer PR1 which define the expanded openings PR-O1', PR-O2', and PR-O3', may be recessed onto the gate insulating layer P-GI. Accordingly, a portion of the upper surface of the gate insulating layer P-GI adjacent to the contact holes CH1, CH2, CH3, and CH4 may be exposed through the expanded openings PR-O1', PR-O2', and PR-O3'. As an example, a portion of the upper surface of the gate insulating layer P-GI surrounding the first contact hole CH1 may be exposed through the first expanded opening PR-O1', and a portion of the upper surface of the gate insulating layer P-GI surrounding the second contact hole CH2 may be exposed through the second expanded opening PR-O2' disposed adjacent to the first expanded opening PR-O1'.

Figure 6E:
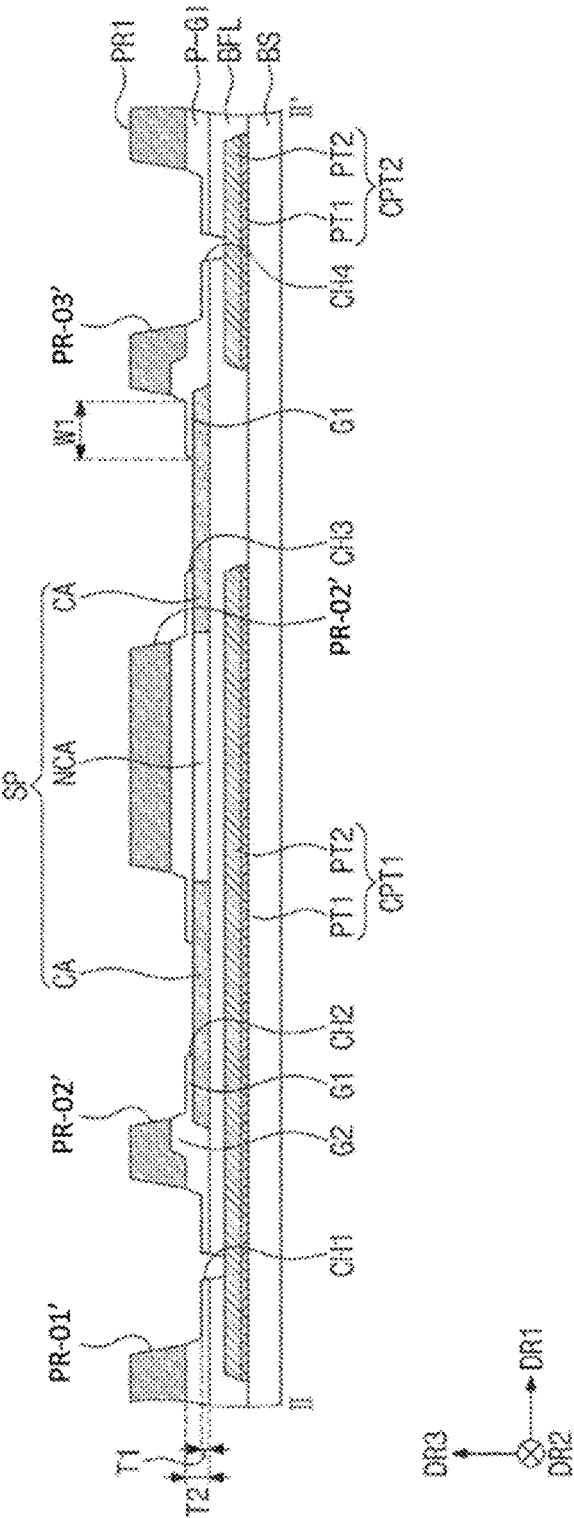

Referring to FIGS. 6D and 6E, after the portion of the first photoresist layer PR1 is ashed, the gate insulating layer P-GI exposed through the expanded openings PR-O1', PR-O2', and PR-O3' may be partially etched. This etching process may correspond to the second etching (S34, refer to FIG. 4).

The second etching of the gate insulating layer P-GI may be carried out by a dry etching process. As an example, a gas used for the additional etching of the gate insulating layer P-GI may include nitrogen trifluoride ($NF_3$) and oxygen ($O_2$). However, the gas used for the additional etching of the gate insulating layer P-GI should not be limited thereto or thereby.

Referring to FIGS. 6A and 6E, as the gate insulating layer P-GI is partially etched at portions exposed through the expanded openings PR-O1', PR-O2', and PR-O3', portions of the gate insulating layer P-GI disposed adjacent to the contact holes CH1, CH2, CH3, and CH4 may have a thin thickness. In the present embodiment, the portions of the gate insulating layer P-GI which have the thin thickness may be referred to as a first portion G1, and the first portion G1 may correspond to a tail of the gate insulating layer P-GI.

The gate insulating layer P-GI that is partially etched may include the first portion G1 having the thin thickness and a second portion G2 extending from the first portion G1 away from the contact holes CH1, CH2, CH3, and CH4. The second portion G2 may have a thickness T2 greater than a thickness T1 of the first portion G1, and the second portion G2 may correspond to a layer portion of the gate insulating layer P-GI. An inclination surface or a side surface of the second portion G2 exposed to the outside by the second etching of the gate insulating layer P-GI may be connected to the upper surface of the first portion G1.

The first portion G1 may be formed in plural areas to correspond to the contact holes CH1, CH2, CH3, and CH4. Accordingly, the first portions G1 may be formed in the gate insulating layer P-GI to be respectively adjacent to the contact holes CH1, CH2, CH3, and CH4. Referring to FIG. 6A, the first portions G1 may be formed to respectively surround the contact holes CH1, CH2, CH3, and CH4 in a plan view. Side surfaces of the first portions G1 exposed to the outside may define the contact holes CH1, CH2, CH3, and CH4, respectively.

The first portion G1 may have a length W1 in a plan view. As an example, the length W1 of the first portion G1 may be equal to or greater than about 0.2 micrometers (μM). The length W1 of the first portion G1 may be controlled by conditions of the ashing process shown in FIG. 6D. In detail, a degree to which the first photoresist layer PR1 is removed may vary by controlling the conditions of the ashing process shown in FIG. 6D. That is, the size of the expanded openings PR-O1', PR-O2', and PR-O3' of the first photoresist layer PR1 in a plan view may vary depending on the conditions of the ashing process. Accordingly, a size of the upper surface of the gate insulating layer P-GI exposed through the expanded openings PR-O1', PR-O2', and PR-O3' may vary, and the length W1 of the first portion G1 may be determined according to the size of the upper surface of the gate insulating layer P-GI exposed through the expanded openings PR-O1', PR-O2', and PR-O3'. As an example, as the size of the upper surface of the gate insulating layer P-GI exposed through the expanded openings PR-O1', PR-O2', and PR-O3' increases, the length W1 of the first portion G1 may increase.

The first portion G1 may have the thickness T1 in a thickness direction. The thickness T1 of the first portion G1 may be smaller than the thickness T2 of the second portion G2. As an example, the thickness T1 of the first portion G1 may be equal to or smaller than about 50% of the thickness T2 of the second portion G2, specifically about 40% or less of the thickness T2 of the second portion G2. As an example, in a case where the gate insulating layer P-GI has the thickness T2 of about 1400 Å, the first portion G1 may have the thickness T1 equal to or smaller than about 700 Å, specifically about 500 Å or less.

The thickness T1 of the first portion G1 may be controlled depending on conditions of the second etching process of the gate insulating layer P-GI shown in FIG. 6E. In detail, the thickness T1 of the first portion G1 may be determined by controlling a degree to which the gate insulating layer P-GI exposed through the first photoresist layer PR1 is etched in the thickness direction.

In the etching process to form the contact holes CH1, CH2, CH3, and CH4 through the gate insulating layer P-GI and the first portions G1 corresponding to the tail of the gate insulating layer P-GI, a portion of the preliminary semiconductor pattern P-SP may be heavily (n+) doped due to an ion bombardment, radiation effect, plasma damage, or UV transmission. As the portion of the preliminary semiconductor pattern P-SP is heavily doped, a heavily doped semiconductor pattern SP may be formed from the preliminary semiconductor pattern P-SP. In the present embodiment, the portion of the semiconductor pattern SP which is heavily doped may be referred to as a conductive area CA.

The semiconductor pattern SP may include the conductive area CA and a non-conductive area NCA. When the second and third contact holes CH2 and CH3 are formed through the gate insulating layer P-GI, conductive areas CA respectively corresponding to the second and third contact holes CH2 and CH3 may be formed in the semiconductor pattern SP, which is exposed without being covered by the gate insulating layer P-GI. That is, the heavily doped conductive areas CA may overlap the second and third contact holes CH2 and CH3, respectively, in a plan view. Accordingly, the contact holes CH2 and CH3 exposing the preliminary semiconductor pattern P-SP may be formed through the gate insulating layer P-GI to expose the portions of the semiconductor pattern SP while forming the conductive areas CA.

The conductive area CA may be formed in the portion of the semiconductor pattern SP which overlaps the first portion G1 of the gate insulating layer P-GI. That is, since the first portion G1 has the thin thickness, the semiconductor pattern SP disposed under the first portion G1 may be heavily doped during the etching process. The first portion G1 of the gate insulating layer P-GI may be formed to form an area which is covered by the first portion G1 of the gate insulating layer P-GI but has conductivity in the semiconductor pattern SP. Accordingly, defects, such as a current path is blocked or a resistance increases, occurring in areas of the semiconductor pattern SP adjacent to the second and third contact holes CH2 and CH3 may be prevented. This will be described in detail later.

The portion of the semiconductor pattern SP, which is covered by the layer portion (i.e., the second portion G2) of the gate insulating layer P-GI, is not heavily doped, and thus, the portion that is not heavily doped may be formed as the non-conductive area NCA. The conductive areas CA may be spaced apart from each other with the non-conductive area NCA interposed therebetween.

Then, the first photoresist layer PR1 may be entirely removed through a removing process of the first photoresist layer PR1.

Figure 7A:
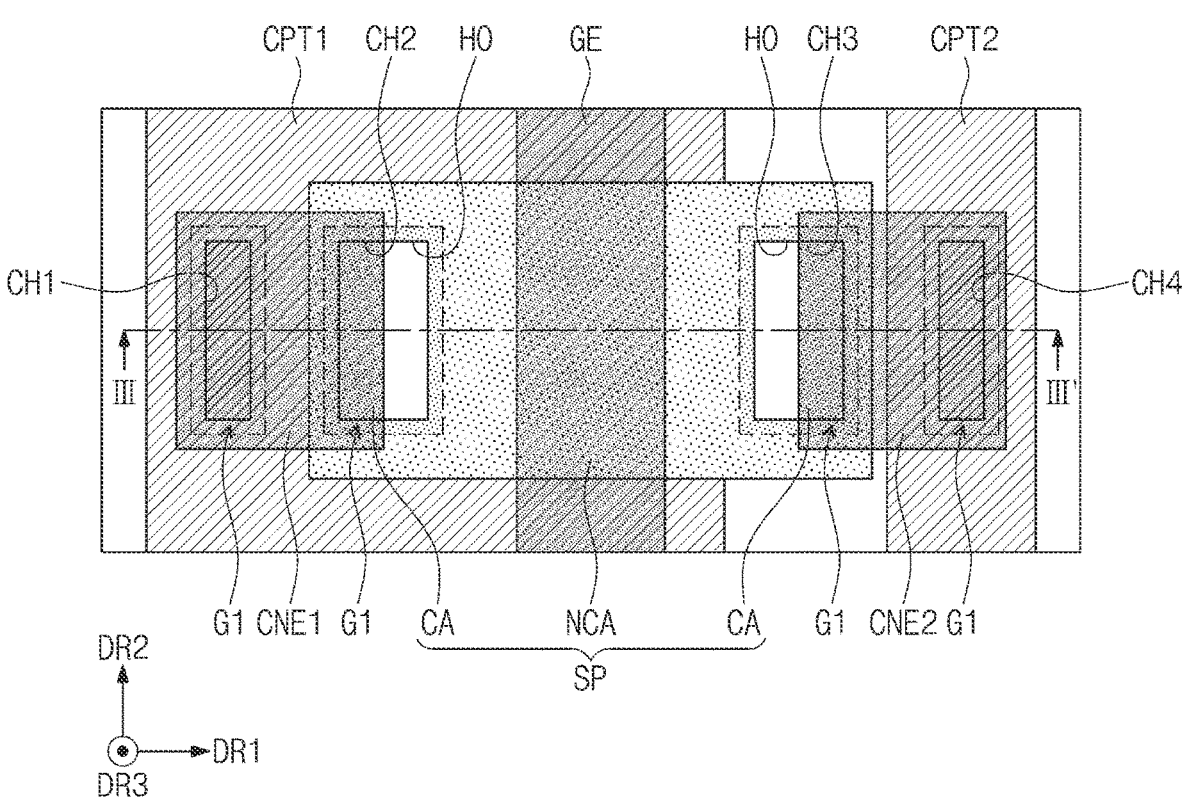
FIG. 7A is a plan view of a process of a manufacturing method of a display panel according to an embodiment of the present disclosure.
Figure 7B:
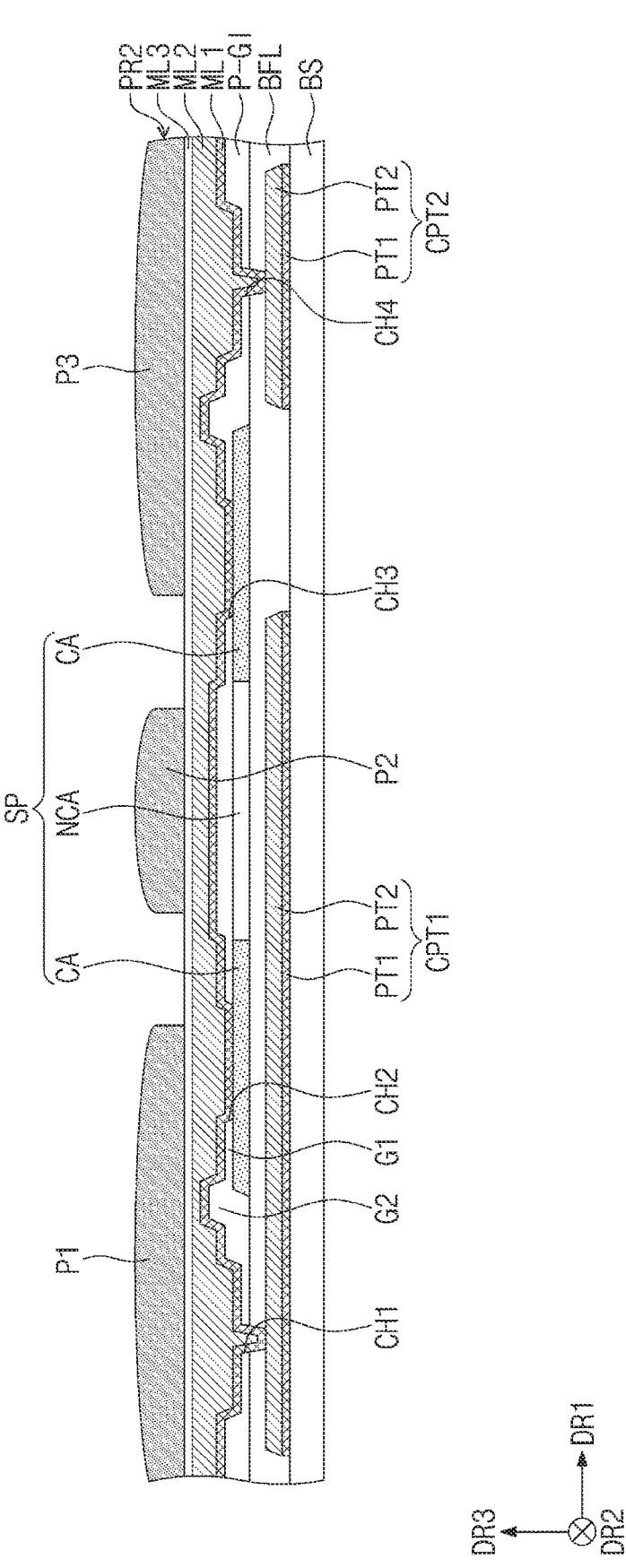
FIGS. 7B and 7C are cross-sectional views of processes of a manufacturing method of a display panel according to an embodiment of the present disclosure.
Figure 7C:
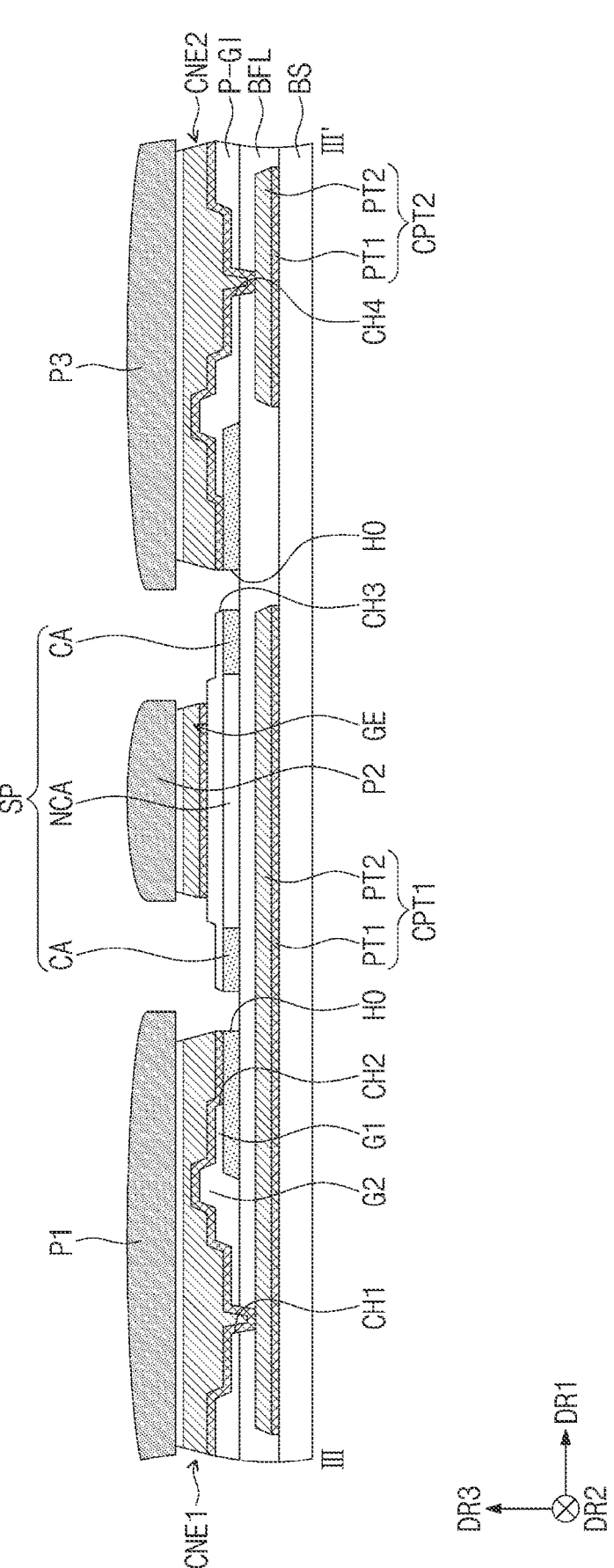

FIG. 7A is a plan view of the display panel according to an embodiment of the present disclosure. FIGS. 7B and 7C are cross-sectional views sequentially showing processes of manufacturing the display panel shown in FIG. 7A. That is, the display panel shown in FIG. 7A may be formed through the processes shown in FIGS. 7B and 7C, and FIG. 7C is a cross-sectional view taken along a line III-III' of FIG. 7A. FIGS. 7A to 7C show the forming of the connection electrode and the gate electrode (S40, refer to FIG. 4).

Referring to FIGS. 7B and 7C, after the first photoresist layer PR1 disposed on the base substrate BS of FIG. 6E is removed, at least one conductive layer may be stacked on the gate insulating layer P-GI to form the connection electrodes CNE1 and CNE2 and the gate electrode GE. FIGS. 7B and 7C show a structure in which first, second, and third conductive layers ML1, ML2, and ML3 are stacked on the gate insulating layer P-GI.

The first, second, and third conductive layers ML1, ML2, and ML3 may be sequentially stacked on the gate insulating layer P-GI in the third direction DR3. As an example, the first, second, and third conductive layers ML1, ML2, and ML3 may be stacked through a sputtering process, however, the present disclosure should not be limited thereto or thereby.

Each of the first, second, and third conductive layers ML1, ML2, and ML3 may include a metal material. As an example, each of the first, second, and third conductive layers ML1, ML2, and ML3 may include one of molybdenum (Mo), aluminum (Al), chromium (Cr), gold (Au), titanium (Ti), nickel (Ni), neodymium (Nd), copper (Cu), and indium tin oxide (ITO) or an alloy thereof.

The first, second, and third conductive layers ML1, ML2, and ML3 may include different metal materials from each other. The second conductive layer ML2 may include a metal material with high conductivity, and the first and third conductive layers ML1 and ML3 respectively disposed under and over the second conductive layer ML2 may include a metal material with a corrosion resistance. As an example, the first conductive layer ML1 may include titanium (Ti), the second conductive layer ML2 may include copper (Cu), and the third conductive layer ML3 may include indium tin oxide (ITO), however, the present disclosure should not be limited thereto or thereby.

The first, second, and third conductive layers ML1, ML2, and ML3 may have different thicknesses from each other. As an example, the second conductive layer ML2 including the metal material with high conductivity may have the largest thickness among the first, second, and third conductive layers ML1, ML2, and ML3. Therefore, the connection electrodes CNE1 and CNE2 and the gate electrode GE, which are formed from the first, second, and third conductive layers ML1, ML2, and ML3 may have a low resistance and a high conductivity.

A second photoresist layer PR2 may be formed on the third conductive layer ML3 that is an uppermost conductive layer. The second photoresist layer PR2 may include a plurality of patterns P1, P2, and P3. The patterns P1, P2, and P3 may be formed by patterning a photoresist layer. The patterns P1, P2, and P3 may be arranged spaced apart from each other in a plan view. The patterns P1, P2, and P3 may be arranged to respectively correspond to areas where the connection electrodes CNE1 and CNE2 and the gate electrode GE are formed. Portions of an upper surface of the third conductive layer ML3 may be exposed without being covered by the patterns P1, P2, and P3.

The patterns P1, P2, and P3 may include a first pattern P1, a second pattern P2, and a third pattern P3. The first pattern P1 may overlap the first contact hole CH1 and a portion of the second contact hole CH2 in a plan view. The first pattern P1 may overlap the first conductive pattern CPT1 and the conductive area CA of the semiconductor pattern SP which is disposed in an area corresponding to the second contact hole CH2 in a plan view. The second pattern P2 may not overlap the contact holes CH1, CH2, CH3, and CH4 in a plan view. The second pattern P2 may overlap the non-conductive area NCA of the semiconductor pattern SP in a plan view. The third pattern P3 may overlap a portion of the third contact hole CH3 and the fourth contact hole CH4 in a plan view. The third pattern P3 may overlap the conductive area CA of the semiconductor pattern SP which is disposed in an area corresponding to the third contact hole CH3 and the fourth contact hole CH4 in a plan view.

The conductive layers ML1, ML2, and ML3 may be etched to form the connection electrodes CNE1 and CNE2 and the gate electrode GE. The conductive layers ML1, ML2, and ML3 may be etched in areas that is not covered by the patterns P1, P2, and P3 of the second photoresist layer PR2. According to an embodiment, the conductive layers ML1, ML2, and ML3 may be etched by a wet etching process.

A first connection electrode CNE1 may be formed from the conductive layers ML1, ML2, and ML3 to correspond to the first pattern P1. The gate electrode GE may be formed from the conductive layers ML1, ML2, and ML3 to correspond to the second pattern P2. A second connection electrode CNE2 may be formed from the conductive layers ML1, ML2, and ML3 to correspond to the third pattern P3.

The first connection electrode CNE1, the second connection electrode CNE2, and the gate electrode GE may be substantially simultaneously formed through the same process. In detail, the first connection electrode CNE1, second connection electrode CNE2, and the gate electrode GE may be substantially simultaneously formed by etching the conductive layers ML1, ML2, and ML3 using the patterns P1, P2, and P3 as a mask. The first connection electrode CNE1, the second connection electrode CNE2, and the gate electrode GE may include the same material as each other and may have the same stack structure. As an example, each of the first connection electrode CNE1, the second connection electrode CNE2, and the gate electrode GE may have a stack structure of Ti/Cu/ITO, however, the present disclosure should not be limited thereto or thereby.

Referring to FIGS. 7A and 7C, the first connection electrode CNE1, the second connection electrode CNE2, and the gate electrode GE may be spaced apart from each other in a plan view.

The first connection electrode CNE1 may overlap the first contact hole CH1 and may be connected to the first conductive pattern CPT1 via the first contact hole CH1. The first connection electrode CNE1 may cover the first portion G1 of the gate insulating layer P-GI disposed adjacent to the first contact hole CH1 or the second contact hole CH2. The first connection electrode CNE1 may be in contact with the semiconductor pattern SP exposed through the second contact hole CH2 in the conductive area CA. The first connection electrode CNE1 may cover a portion of the first portion G1 of the gate insulating layer P-GI disposed adjacent to the second contact hole CH2.

That is, the first connection electrode CNE1 may be connected to the first conductive pattern CPT1 and the conductive area CA of the semiconductor pattern SP. The first conductive pattern CPT1 may be electrically connected to the semiconductor pattern SP via the first connection electrode CNE1.

The second connection electrode CNE2 may overlap the fourth contact hole CH4 and may be connected to the second conductive pattern CPT2 via the fourth contact hole CH4. The second connection electrode CNE2 may cover the first portion G1 of the gate insulating layer P-GI disposed adjacent to the third contact hole CH3 or the fourth contact hole CH4. The second connection electrode CNE2 may be connected to the semiconductor pattern SP exposed through the third contact hole CH3 in the conductive area CA. The second connection electrode CNE2 may cover a portion of the first portion G1 of the gate insulating layer P-GI disposed adjacent to the third contact hole CH3.

That is, the second connection electrode CNE2 may be connected to the second conductive pattern CPT2 and the conductive area CA of the semiconductor pattern SP. The second conductive pattern CPT2 may be electrically connected to the semiconductor pattern SP via the second connection electrode CNE2.

The gate electrode GE may be disposed on the gate insulating layer P-GI. The gate electrode GE may be spaced apart from the semiconductor pattern SP with the gate insulating layer P-GI interposed therebetween in the thickness direction. The gate electrode GE may overlap the non-conductive area NCA of the semiconductor pattern SP in a plan view.

When the conductive layers ML1, ML2, and ML3 are etched, portions of the semiconductor pattern SP which is not covered by the second photoresist layer PR2 may be etched. Accordingly, holes HO may be formed through the semiconductor pattern SP. The holes HO may be formed in the conductive area CA of the semiconductor pattern SP. The holes HO may be spaced apart from each other and may be surrounded by the semiconductor pattern SP in a plan view. The holes HO may be formed in the second and third contact holes CH2 and CH3 which are not covered by the connection electrodes CNE1 and CNE2 and the gate insulating layer P-GI.

The conductive layers ML1, ML2, and ML3 may include different materials from each other, and thus, may have different etch rates with respect to the same etchant. As an example, among the conductive layers ML1, ML2, and ML3, the third conductive layer ML3 may have the lowest etch rate, an edge of the third conductive layer ML3 may protrude more than a side surface of the second conductive layer ML2, and thus, a tip may be formed in the third conductive layer ML3. In this case, an additional etching process may be carried out to remove the tip of the third conductive layer ML3. That is, portions of the conductive layers ML1, ML2, and ML3 which is not covered by the patterns P1, P2, and P3 may be etched through the first etching process, and the tip formed in the conductive layers ML1, ML2, and ML3 may be removed through the second etching process.

Portions of an inner side surface of the semiconductor pattern SP, which are exposed through the second and third contact holes CH2 and CH3 and the holes HO, may be additionally etched through the second etching process. Accordingly, portions of the inner side surface of the semiconductor pattern SP may be undercut under the gate insulating layer P-GI. According to the present embodiment, even though the inner side surface of the semiconductor pattern SP is undercut in the areas disposed adjacent to the second and third contact holes CH2 and CH3, the current path may not be blocked since the semiconductor pattern SP overlapping the first portion G1 of the gate insulating layer P-GI may serve as the conductive area CA.

Figure 8A:
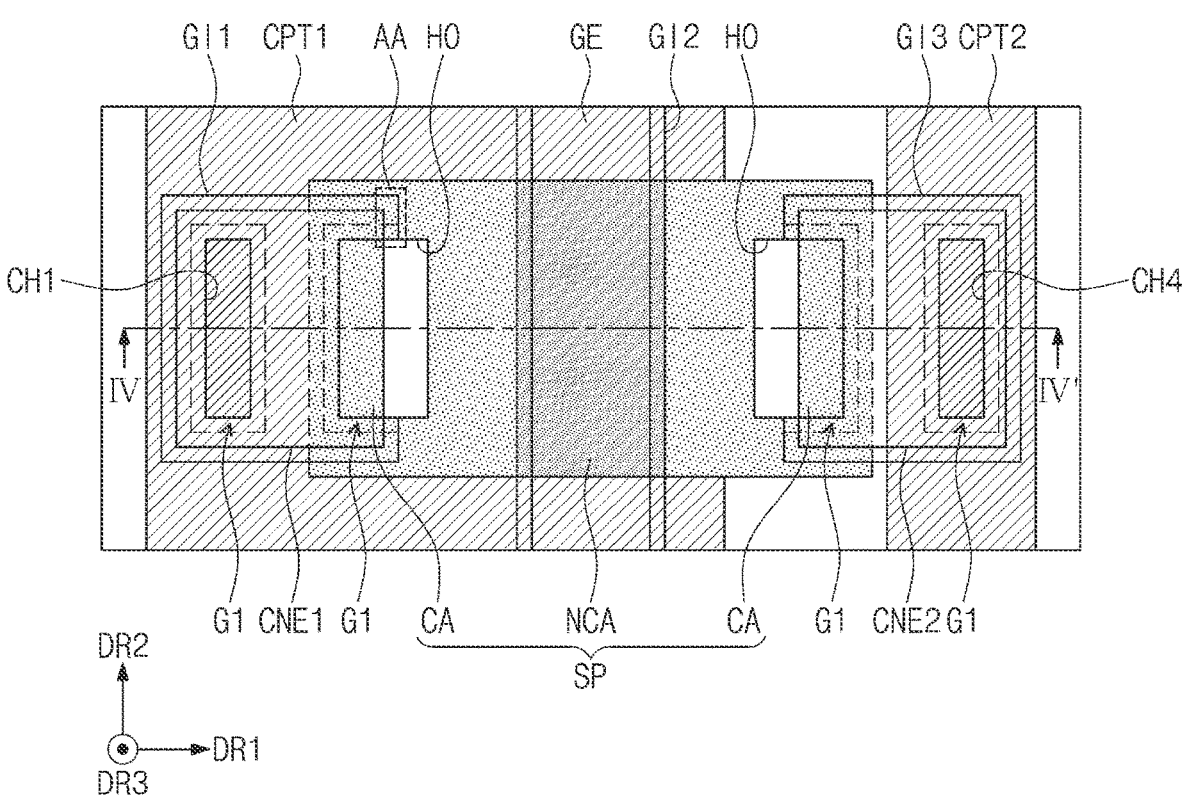
FIG. 8A is a plan view of a process of a manufacturing method of a display panel according to an embodiment of the present disclosure.
Figure 8B:
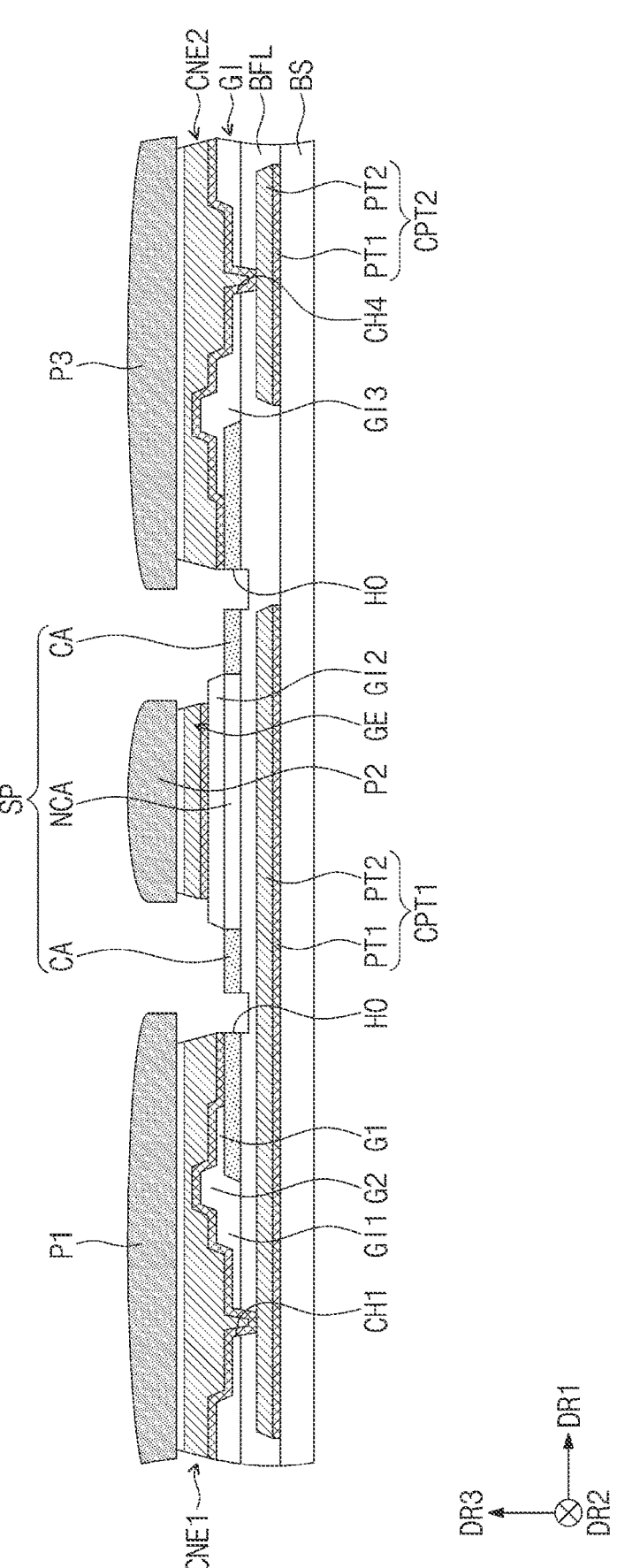
FIGS. 8B and 8C are cross-sectional views of processes of a manufacturing method of a display panel according to an embodiment of the present disclosure.
Figure 8C:
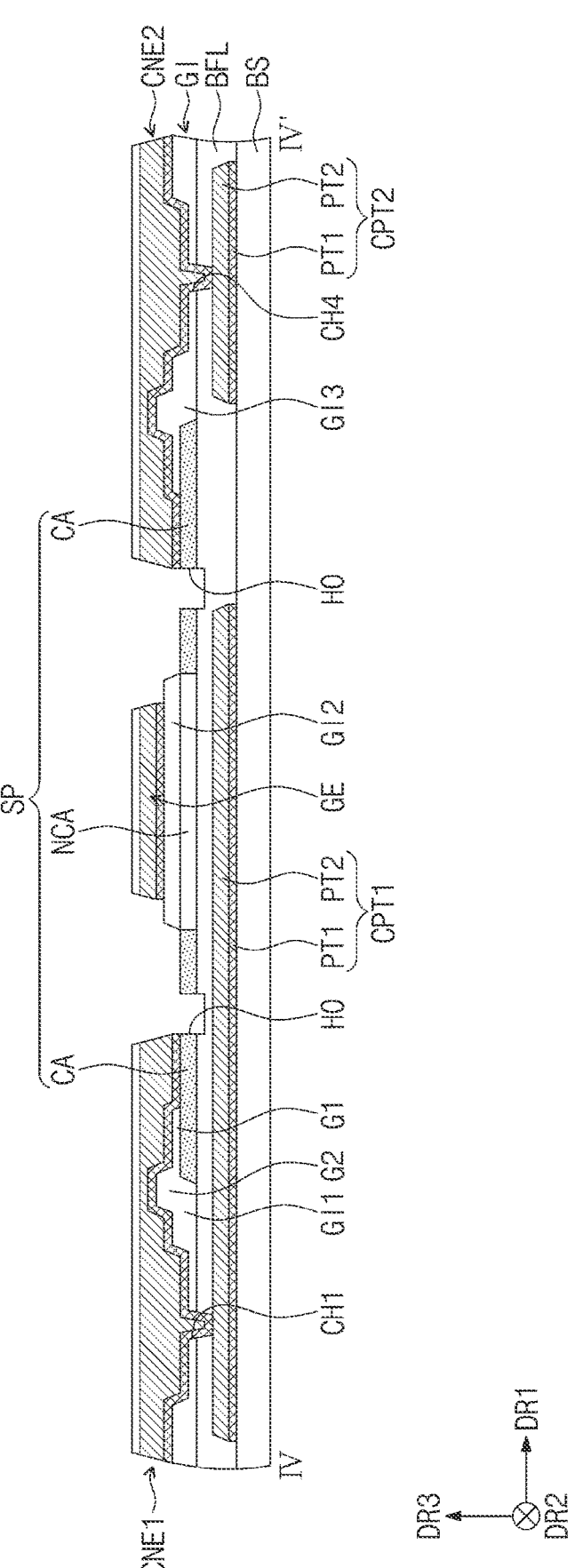
Figure 8D:
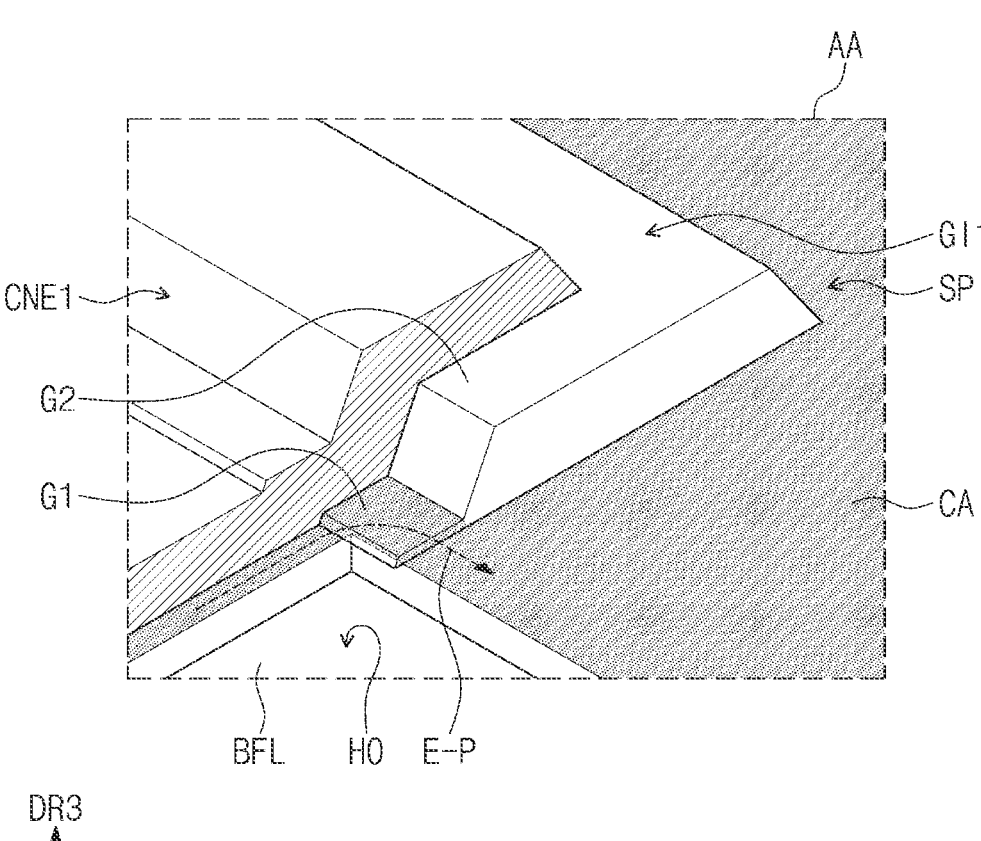
FIG. 8D is a perspective view of some components of the display panel in an area of FIG. 8A according to an embodiment of the present disclosure.
Figure 8D:
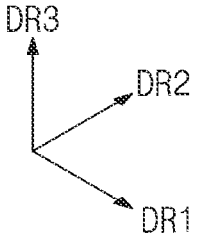
Figure 8E:
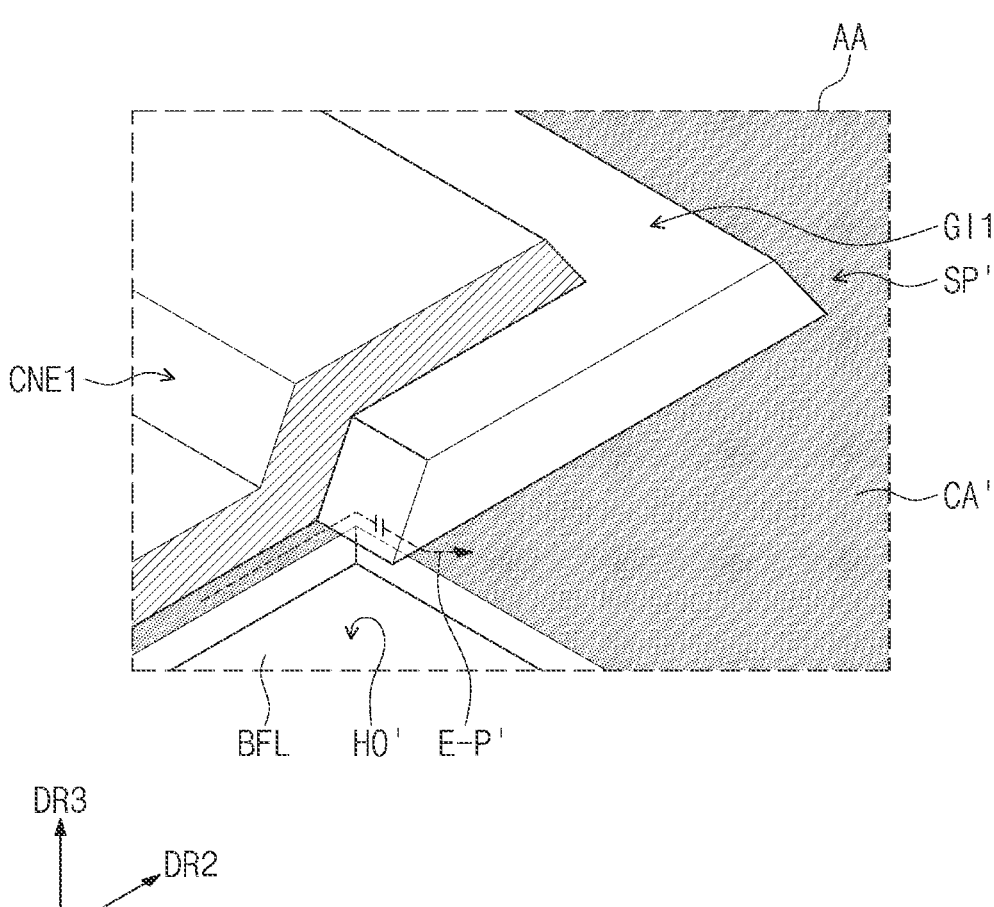
FIG. 8E is a perspective view of a display panel according to a comparative example.

FIG. 8A is a plan view of the display panel according to an embodiment of the present disclosure. FIGS. 8B and 8C are cross-sectional views sequentially showing processes to manufacture the display panel shown in FIG. 8A. That is, the display panel shown in FIG. 8A may be formed through the processes shown in FIGS. 8B and 8C, and FIG. 8C is a cross-sectional view taken along a line IV-IV' of FIG. 8A. FIGS. 8A to 8C show the forming of the gate insulating patterns from the gate insulating layer. FIG. 8D is a perspective view of some components of the display panel in an area AA of FIG. 8A according to an embodiment of the present disclosure, and FIG. 8E is a perspective view of a display panel according to a comparative example.

Referring to FIG. 8B, the gate insulating layer P-GI (refer to FIG. 7C) may be etched to form gate insulating patterns GI1, GI2, and GI3 which are spaced apart from each other from the gate insulating layer P-GI (refer to FIG. 7C). According to an embodiment, the gate insulating layer P-GI (refer to FIG. 7C) may be etched through a dry etching process after the second photoresist layer PR2 is formed. Accordingly, portions of the gate insulating layer P-GI (refer to FIG. 7C) which is not covered by the second photoresist layer PR2, may be etched and removed, and portions covered by the first, second, and third patterns P1, P2, and P3 may be formed as the gate insulating patterns GI1, GI2, and GI3, respectively. As the gate insulating layer P-GI (refer to FIG. 7C) is additionally etched using the second photoresist layer PR2 as a mask, the gate insulating layer P-GI (refer to FIG. 7C) may be patterned without employing an additional mask. In the present embodiment, the gate insulating patterns GI1, GI2, and GI3 may be defined as a gate insulating pattern layer GI. A portion of an upper surface of the buffer layer BFL overlapping the hole HO may be not covered by the second photoresist layer PR2. The portion of the buffer layer BFL exposed by the hole HO may be recessed by additionally etching of the gate insulating layer P-GI (refer to FIG. 7C), however, the present disclosure should not be limited thereto or thereby.

Referring to FIGS. 8A and 8C, the second photoresist layer PR2 may be removed after the gate insulating patterns GI1, GI2, and GI3 are formed.

The gate insulating patterns GI1, GI2, and GI3 may be spaced apart from each other in a plan view. The gate insulating patterns GI1, GI2, and GI3 may include a first insulating pattern GI1, a second insulating pattern GI2, and a third insulating pattern GI3.

The first insulating pattern GI1 may be disposed between the first connection electrode CNE1 and the semiconductor pattern SP in the thickness direction. The first contact hole CH1 may be formed through the first insulating pattern GI1, and the first connection electrode CNE1 may cover the first contact hole CH1 and may be connected to the first conductive pattern CPT1. The second contact hole CH2 (refer to FIG. 7C) which is exposed without being covered by the first connection electrode CNE1 may be expanded as a separation space between the first insulating pattern GI1 and the second insulating pattern GI2 when the gate insulating layer P-GI (refer to FIG. 7C) is additionally etched. One side of the first insulating pattern GI1 adjacent to the hole HO may be covered by the first connection electrode CNE1.

The first insulating pattern GI1 may include the first portion G1 and the second portion G2 which are integrally connected to each other and have different thicknesses, and details of the first portion G1 and the second portion G2 described above may be equally applied to the first portion G1 and the second portion G2. The first portion G1 of the first insulating pattern GI1 may be disposed adjacent to the first contact hole CH1 or the hole HO of the semiconductor pattern SP.

The third insulating pattern GI3 may be disposed between the second connection electrode CNE2 and the semiconductor pattern SP in the thickness direction. The fourth contact hole CH4 may be formed through the third insulating pattern GI3, and the second connection electrode CNE2 may cover the fourth contact hole CH4 and may be connected to the second conductive pattern CPT2. The third contact hole CH3 (refer to FIG. 7C) which is exposed without being covered by the second connection electrode CNE2 may be expanded as a separation space between the third insulating pattern GI3 and the second insulating pattern GI2 when the gate insulating layer P-GI (refer to FIG. 7C) is additionally etched. One side of the third insulating pattern GI3 adjacent to the hole HO may be covered by the second connection electrode CNE2.

The third insulating pattern GI3 may include the first portion G1 and the second portion G2 which are integrally connected to each other and have different thicknesses. The first portion G1 of the third insulating pattern GI3 may be disposed adjacent to the fourth contact hole CH4 or the hole HO of the semiconductor pattern SP.

The second insulating pattern GI2 may be disposed between the gate electrode GE and the semiconductor pattern SP in the thickness direction. The second insulating pattern GI2 may be disposed between the first insulating pattern GI1 and the third insulating pattern GI3 in a plan view. The first portion G1 adjacent to the gate electrode GE may be etched when the gate insulating layer P-GI (refer to FIG. 7C) is additionally etched, and thus, the second insulating pattern GI2 may not include the first portion G1, however, the present disclosure should not be limited thereto or thereby. According to an embodiment, the second insulating pattern GI2 may include the first portion G1.

When the gate insulating layer P-GI (refer to FIG. 7C) is etched to form the gate insulating patterns GI1, GI2, and GI3, the semiconductor pattern SP may be heavily doped in areas where the gate insulating layer P-GI (refer to FIG. 7C) is removed. Accordingly, the conductive areas CA of the semiconductor pattern SP may be expanded.

The conductive areas CA may be spaced apart from each other with the non-conductive area NCA interposed therebetween in a plan view. The conductive areas CA may respectively correspond to a source area and a drain area of the semiconductor pattern SP, and the non-conductive area NCA may correspond to a channel area (or active area) of the semiconductor pattern SP.

One side of the second insulating pattern GI2 may protrude further outward than the gate electrode GE. As an example, a width in the first direction DR1 of the second insulating pattern GI2 may be greater than a width in the first direction DR1 of the gate electrode GE. Accordingly, the gate electrode GE and the semiconductor pattern SP may be prevented from being electrically connected to each other.

Since the first and third insulating patterns GI1 and GI3 are formed under the same process conditions as those of the second insulating pattern GI2, the first and third insulating patterns GI1 and GI3 may include portions expanded outward than the first and second connection electrodes CNE1 and CNE2, respectively.

According a comparative example, the semiconductor pattern SP overlapping the first and third insulating patterns GI1 and GI3 may not be heavily doped by the first and third insulating patterns GI1 and GI3 which are disposed adjacent to the hole HO and expanded outward than the connection electrodes CNE1 and CNE2, and, thus, the current path may be blocked. However, according to an embodiment of the present disclosure, the semiconductor pattern SP overlapping the first portions G1 of the first and third insulating patterns GI1 and GI3 may be heavily doped by the first portions G1 which are disposed adjacent to the hole HO and have the thin thickness, and the current path may be prevented from being blocked in the area disposed adjacent to the hole HO. This will be described in detail with reference to FIGS. 8D and 8E.

FIG. 8D shows a movement path E-P of an electric current in the area disposed adjacent to the hole HO according to an embodiment of the present disclosure, and FIG. 8E shows a movement path E-P' of an electric current in an area adjacent to a hole HO' according to the comparative example.

Referring to FIG. 8D, the first insulating pattern GI1 may be disposed between the first connection electrode CNE1 and the semiconductor pattern SP in the area disposed adjacent to the hole HO of the semiconductor pattern SP. The first insulating pattern GI1 may further protrude outward than a side surface of the first connection electrode CNE1. This may be controlled depending on conditions of the etching process to form the gate insulating pattern layer GI.

The first insulating pattern GI1 may include the first portion G1 and the second portion G2 extending from the first portion G1. As described above, the thickness of the first portion G1 may be smaller than the thickness of the second portion G2, and in detail, the thickness of the first portion G1 may be equal to or smaller than about 50% of the thickness of the second portion G2.

As the portion of the first connection electrode CNE1 is in contact with the conductive area CA of semiconductor pattern SP, electrical signals applied to the first connection electrode CNE1 may be applied to the semiconductor pattern SP. In the etching process to form the first connection electrode CNE1, the hole HO may be formed through the semiconductor pattern SP in an area disposed adjacent to the first connection electrode CNE1, and the movement path of the electric current may be limited by the hole HO. However, since the first portion G1 may be formed in an area disposed adjacent to the hole HO and the first portion G1 has the thin thickness, the semiconductor pattern SP overlapping the first portion G1 may be heavily doped during the process of forming the first portion G1 and may have the conductivity. The heavily doped portion may serve as the movement path of the electric current under the first insulating pattern GI1.

When the first connection electrode CNE1 is formed, the inner side surface of the semiconductor pattern SP exposed to the outside through the hole HO may be additionally etched and may be undercut under the first insulating pattern GI1. However, even though the inner side surface of the semiconductor pattern SP is partially undercut, the movement path E-P of the electric current may not be blocked since the semiconductor pattern SP has the conductivity in the area corresponding to the first portion G1. Accordingly, it is possible to prevent the resistance from increasing or ions from being deteriorated in the conductive area CA of the semiconductor pattern SP, the manufacturing process of the display panel may be simplified, and the reliability of the display panel may be improved.

Meanwhile, although the above descriptions are based on the area in which the first connection electrode CNE1 is disposed, the above descriptions may be equally applied to the area in which the second connection electrode CNE2 is disposed.

Referring to FIG. 8E, a first insulating pattern GI1' may be disposed between a first connection electrode CNE1 and a semiconductor pattern SP' in an area disposed adjacent to the hole HO' of the semiconductor pattern SP' and may be further expanded outward than a side surface of the first connection electrode CNE1.

The first insulating pattern GI1' of the comparative example does not include the first portion G1 (refer to FIG. 8D) corresponding to the tail in the present disclosure. That is, the first insulating pattern GI1' of the comparative example includes only a layer portion corresponding to the second portion G2 (refer to FIG. 8D).

As the first insulating pattern GI1' does not include the tail and has a predetermined thickness in the process of forming the first insulating pattern GI1' of the comparative example, an area of the semiconductor pattern SP' disposed under the first insulating pattern GI1' has a low conductivity or no conductivity. Different from the present disclosure, a movement path of electric current is not sufficiently secured in the area disposed adjacent to the hole HO' in the comparative example, and thus, a resistance in the semiconductor pattern SP' increases.

In addition, in a case where an inner side surface of the semiconductor pattern SP' exposed to the outside via the hole HO' is additionally etched and is undercut under the first insulating pattern GI1' in the process of forming the first connection electrode CNE1, the movement path E-P' of the electric current is blocked in a conductive area CA' of the comparative example. Accordingly, a resistance increases or ions are deteriorated in the conductive area CA' of the comparative example, and a reliability of the display panel according to the comparative example may be lowered.

Meanwhile, the manufacturing method of the display panel may further include forming an insulating layer and a light emitting element on the connection electrodes CNE1 and CNE2 and the gate electrode GE after the process shown in FIG. 8C. The display panel formed through the processes of the manufacturing method of the display panel will be described in detail with reference to FIG. 9.

Figure 9:
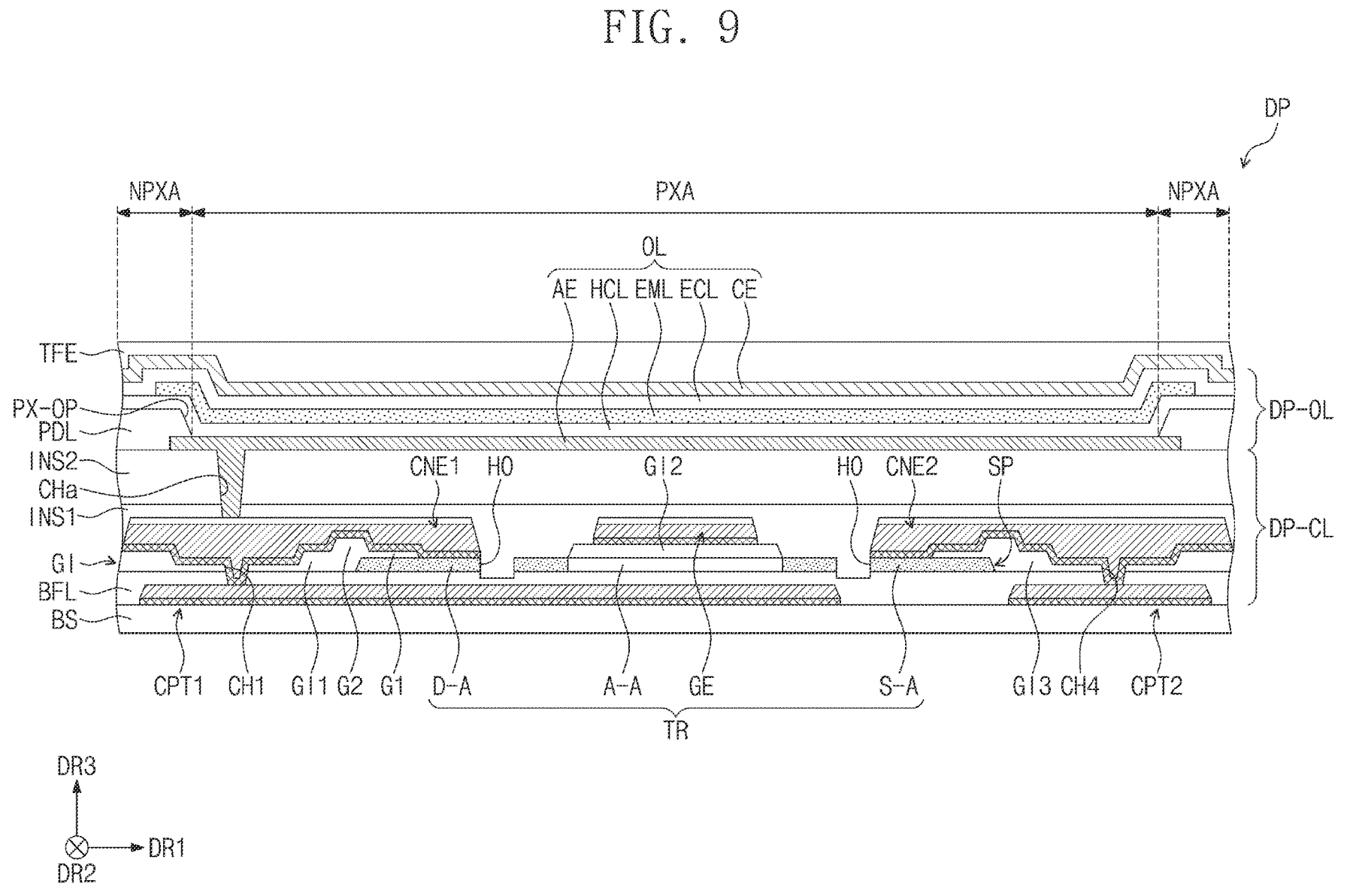

FIG. 9 is a cross-sectional view of the display panel DP according to an embodiment of the present disclosure.

Referring to FIG. 9, the display panel DP may include the base substrate BS, the circuit layer DP-CL, the display element layer DP-OL, and the encapsulation layer TFE. The configurations of the display panel DP described above may be equally applied to the configurations of the display panel DP shown in FIG. 9.

The circuit layer DP-CL may include the conductive patterns CPT1 and CPT2, a transistor TR, the connection electrodes CNE1 and CNE2, the buffer layer BFL, the gate insulating pattern layer GI, and insulating layers INS1 and INS2 disposed on the base substrate BS.

The conductive patterns CPT1 and CPT2 may include the first conductive pattern CPT1 and the second conductive pattern CPT2 spaced apart from the first conductive pattern CPT1 in a plan view. Each of the first and second conductive patterns CPT1 and CPT2 may have the structure in which the pattern portions PT1 and PT2 (refer to FIG. 8C) are stacked, however, it should not be limited thereto or thereby. According to an embodiment, each of the first and second conductive patterns CPT1 and CPT2 may have a single-layer structure.

The first and second conductive patterns CPT1 and CPT2 may be disposed on the same layer and may include the same material. The first and second conductive patterns CPT1 and CPT2 may have the same stack structure as each other. As an example, each of the first and second conductive patterns CPT1 and CPT2 may have a two-layer structure of Ti/CU, however, the present disclosure should not be limited thereto or thereby.

The buffer layer BFL may be disposed on the base substrate BS to cover the first and second conductive patterns CPT1 and CPT2. The buffer layer BFL may include at least one inorganic layer.

The transistor TR may include the semiconductor pattern SP and the gate electrode GE. The semiconductor pattern SP may be disposed on the buffer layer BFL. The adhesion of the semiconductor pattern SP may be improved by the buffer layer BFL. The semiconductor pattern SP may include a semiconductor material, such as polycrystalline silicon, crystalline silicon, or metal oxide.

A source area S-A, an active area A-A, and a drain area D-A of the transistor TR may be formed from the semiconductor pattern SP. The source area S-A and the drain area D-A may correspond to the conductive areas CA (refer to FIG. 8C) of the semiconductor pattern SP, and the active area A-A may correspond to the non-conductive area NCA (refer to FIG. 8C) of the semiconductor pattern SP. The semiconductor pattern SP may have different electrical properties depending on whether it is doped or not or whether a metal oxide is reduced or not. The source area S-A and the drain area D-A of the semiconductor pattern SP which have a relatively high conductivity may serve as an electrode or a signal line. A non-doped portion, a portion doped with a low doping concentration, or a non-reduced portion of the semiconductor pattern SP may correspond to the active area A-A with a relatively low conductivity.

At least one hole HO may be defined through the semiconductor pattern SP. The hole HO may be formed during the etching process of forming the connection electrodes CNE1 and CNE2 and the gate electrode GE. FIG. 9 shows a structure in which the holes HO are formed through the semiconductor pattern SP and spaced apart from each other as a representative example. Among the holes HO, one hole HO may be surrounded by the source area S-A in a plan view, and the other hole HO may be surrounded by the drain area D-A, however, the present disclosure should not be limited thereto or thereby. The portion of the upper surface of the buffer layer BFL may be exposed by the hole HO and be recessed in the process of forming the circuit layer DP-CL, however, the present disclosure should not be limited thereto or thereby. According to an embodiment, the hole HO may not be formed through the semiconductor pattern SP or the recessed portion of the buffer layer BFL may not be formed depending on the process of forming the circuit layer DP-CL.

The gate insulating pattern layer GI may be disposed on the buffer layer BFL. The gate insulating pattern layer GI may include at least one inorganic layer. The gate insulating pattern layer GI may include the first, second, and third insulating patterns GI1, GI2, and GI3 spaced apart from each other. The first insulating pattern GI1 may cover a portion of the drain area D-A and may be disposed above the first conductive pattern CPT1. The second insulating pattern GI2 may be disposed in the active area A-A. The third insulating pattern GI3 may cover a portion of the source area S-A and may be disposed above the second conductive pattern CPT2.

Among the first, second, and third insulating patterns GI1, GI2, and GI3, at least one insulating pattern may include the first portion G1 and the second portion G2 which have different thicknesses from each other. The details of the first and second portions G1 and G2 described above may be equally applied to the first portion G1 and the second portion G2. As an example, the first insulating pattern GI1 may include the first portion G1 disposed adjacent to the drain area D-A and the first contact hole CH1, and the second portion G2 extending from the first portion G1 away from the hole HO and the first contact hole CH1, respectively, and having the thickness greater than that of the first portion G1. The third insulating pattern GI3 may include the first portion G1 disposed adjacent to the source area S-A and the fourth contact hole CH4, and the second portion G2 extending from the first portion G1 away from the hole HO and the fourth contact hole CH4, respectively, and having the thickness greater than that of the first portion G1. According to an embodiment, the second insulating pattern GI2 may also include the first portion G1 adjacent to the source area S-A or the drain area D-A. The thickness of the first portion G1 may be equal to or smaller than about 50% of the thickness of the second portion G2. As an example, the second portion G2 may have the thickness of about 1400 Å, and the first portion G1 may have the thickness of about 500 Å.

The connection electrodes CNE1 and CNE2 may include the first connection electrode CNE1 and the second connection electrode CNE2.

The first connection electrode CNE1 may be disposed on the first insulating pattern GI1. The first connection electrode CNE1 may be connected to the first conductive pattern CPT1 via the first contact hole CH1 defined through the buffer layer BFL and the first insulating pattern GI1. The first connection electrode CNE1 may be in contact with a portion of the drain area D-A and may be connected to the drain area D-A. The drain area D-A and the first conductive pattern CPT1 may be electrically connected to each other by the first connection electrode CNE1. As the first conductive pattern CPT1 with high conductivity is connected to the drain area D-A, current transfer characteristics may be improved.

The second connection electrode CNE2 may be disposed on the third insulating pattern GI3. The second connection electrode CNE2 may be connected to the second conductive pattern CPT2 via the fourth contact hole CH4 defined through the buffer layer BFL and the third insulating pattern GI3. The second connection electrode CNE2 may be in contact with a portion of the source area S-A and may be connected to the source area S-A. The source area S-A and the second conductive pattern CPT2 may be electrically connected to each other by the second connection electrode CNE2. The second connection electrode CNE2 may be connected to a power line that supplies a power to a light emitting element OL, and thus, may supply a first voltage to the transistor TR.

The gate electrode GE may be disposed on the second insulating pattern GI2. The gate electrode GE may overlap the active area A-A in a plan view and may be spaced apart from the semiconductor pattern SP with the second insulating pattern GI2 interposed therebetween in the thickness direction.

The connection electrodes CNE1 and CNE2 may be spaced apart from the gate electrode GE in a plan view. The connection electrodes CNE1 and CNE2 and the gate electrode GE may have a multi-layer structure in which conductive layers including different materials from each other are stacked. In FIG. 9, the connection electrodes CNE1 and CNE2 and the gate electrode GE having the multi-layer structure, e.g., a three-layer structure, are shown as a representative example, however, the present disclosure should not be limited thereto or thereby. According to an embodiment, the connection electrodes CNE1 and CNE2 and the gate electrode GE may have a multi-layer structure with a fewer or more number layers than three or may have a single-layer structure.

The connection electrodes CNE1 and CNE2 and the gate electrode GE may be substantially simultaneously formed through the same process. The connection electrodes CNE1 and CNE2 and the gate electrode GE may have the same stack structure as each other. As an example, the connection electrodes CNE1 and CNE2 and the gate electrode GE may have the three-layer structure of Ti/Cu/ITO, however, the present disclosure should not be limited thereto or thereby.

The first insulating layer INS1 may be disposed on the gate insulating pattern layer GI to cover the connection electrodes CNE1 and CNE2 and the gate electrode GE. The second insulating layer INS2 may be disposed on the first insulating layer INS1. Each of the first insulating layer INS1 and the second insulating layer INS2 may include at least one inorganic layer or an organic layer. The inorganic layer may include at least one of aluminum oxide, titanium oxide, silicon oxide, silicon nitride, silicon oxynitride, zirconium oxide, and hafnium oxide, however, the present disclosure should not be limited thereto or thereby. The organic layer may include a phenolic-based polymer, an acrylic-based polymer, an imide-based polymer, an aryl ether-based polymer, an amide-based polymer, a fluorine-based polymer, a p-xylene-based polymer, a vinyl alcohol-based polymer, or blends thereof. However, the material for the organic layer should not be limited thereto or thereby.

The display element layer DP-OL may be disposed on the circuit layer DP-CL. The display element layer DP-OL may include a pixel definition layer PDL and the light emitting element OL. As an example, the light emitting element OL may include an organic light emitting element, an inorganic light emitting element, a quantum dot light emitting element, a micro-LED light emitting element, or a nano-LED light emitting element, however, the present disclosure should not be limited thereto or thereby. The light emitting element OL may include various embodiments as long as a light is generated or an amount of the light is controlled according to electrical signals.

The pixel definition layer PDL may be disposed on the second insulating layer INS2 of the circuit layer DP-CL. The pixel definition layer PDL may include a polymer resin. As an example, the pixel definition layer PDL may include a polyacrylate-based resin or a polyimide-based resin. The pixel definition layer PDL may further include an inorganic material in addition to the polymer resin. According to an embodiment, the pixel definition layer PDL may include an inorganic material. As an example, the pixel definition layer PDL may include silicon nitride ($SiN_x$), silicon oxide ($SiO_x$), or silicon oxynitride ($SiO_xN_y$).

The pixel definition layer PDL may include a light absorbing material. The pixel definition layer PDL may include a black coloring agent. The black coloring agent may include a black pigment or a black dye. The black coloring agent may include a metal material, such as chrome or an oxide thereof, etc., or carbon black. However, the pixel definition layer PDL should not be limited thereto or thereby.

The light emitting element OL may include a first electrode AE, a hole transport layer HCL, a light emitting layer EML, an electron transport layer ECL, and a second electrode CE, which are sequentially stacked.

The first electrode AE may be disposed on the second insulating layer INS2 of the circuit layer DP-CL. The first electrode AE may be connected to the first connection electrode CNE1 via a contact hole CHa defined through the first insulating layer INS1 and the second insulating layer INS2. As the first electrode AE is connected to the first connection electrode CNE1, the drain area D-A may be electrically connected to the light emitting element OL by the first connection electrode CNE1.

The pixel definition layer PDL may be provided with a light emitting opening PX-OP defined therethrough to expose at least a portion of the first electrode AE. The portion of the first electrode AE exposed through the light emitting opening PX-OP may correspond to a light-emitting area PXA. The area in which the pixel definition layer PDL is disposed may correspond to the non-light-emitting area NPXA. The non-light-emitting area NPXA may surround the light-emitting area PXA.

The hole transport layer HCL may be disposed on the first electrode AE. The hole transport layer HCL may include at least one of a hole injection layer, a hole transport layer, and an electron block layer. In addition, the hole transport layer HCL may include a plurality of hole transport layers.

The light emitting layer EML may be disposed on the hole transport layer HCL. The light emitting layer EML may have a single-layer structure of a single material, a single-layer structure of different materials, or a multi-layer structure of layers including different materials. According to an embodiment, the light emitting layer EML may generate a blue light as the source light, however, the present disclosure should not be limited thereto or thereby. The display element layer DP-OL may include light emitting elements OL including light emitting layers EML that emit light having different wavelengths from each other.

The light emitting layer EML may be provided in the form of light emitting pattern to be placed in an area corresponding to the light emitting opening PX-OP, however, the present disclosure should not be limited thereto or thereby. According to an embodiment, the light emitting layer EML may be provided as a common layer that overlaps the light-emitting area PXA and the non-light-emitting area NPXA.

The electron transport layer ECL may be disposed on the light emitting layer EML. The electron transport layer ECL may include at least one of a hole block layer, an electron transport layer, and an electron injection layer, however, the present disclosure should not be limited thereto or thereby.

The hole transport layer HCL, the light emitting layer EML, and the electron transport layer ECL may be formed by various methods, such as a vacuum deposition method, a spin coating method, a cast method, an LB (Langmuir-Blodgett) method, an inkjet printing method, a laser printing method, an LITI (Laser Induced Thermal Imaging) method, etc.

The second electrode CE may be disposed on the electron transport region ECL. The second electrode CE may be a common electrode. That is, the second electrode CE may be provided as a common layer to overlap the entire area of the light-emitting area PXA and the non-light-emitting area NPXA.

The encapsulation layer TFE may cover the light emitting element OL. The encapsulation layer TFE may encapsulate the display element layer DP-OL. The encapsulation layer TFE may include at least one insulating layer. According to an embodiment, the encapsulation layer TFE may include at least one inorganic layer (hereinafter, referred to as an encapsulation inorganic layer). According to an embodiment, the encapsulation layer TFE may include encapsulation inorganic layers and at least one organic layer (hereinafter, referred to as an encapsulation organic layer) disposed between the encapsulation inorganic layers.

The encapsulation inorganic layer may protect the display element layer DP-OL from moisture and oxygen, and the encapsulation organic layer may protect the display element layer DP-OL from a foreign substance such as dust particles. The encapsulation inorganic layer may include silicon nitride, silicon oxynitride, silicon oxide, titanium oxide, or aluminum oxide, however, it should not be limited thereto or thereby. The encapsulation organic layer may include an acryl-based compound, an epoxy-based compound, or the like. The encapsulation organic layer may include a photo-polymerizable organic material, and it should not be particularly limited.

The gate insulating layer according to the present disclosure may include the tail disposed adjacent to the contact hole and having the thin thickness. In the etching process of forming the tail of the gate insulating layer, the semiconductor pattern may be heavily doped to have the conductivity in the area overlapping the tail. Then, the portion of the semiconductor pattern may be etched in the etching process of the connection electrode and the gate electrode, and thus, the hole may be formed through the semiconductor pattern. In this case, the semiconductor pattern may have the conductivity in the area overlapping the tail, and thus, the current path may be secured around the hole of the semiconductor pattern. As a result, the resistance may be prevented from increasing in the semiconductor pattern.

Although the embodiments of the present disclosure have been described, it is understood that the present disclosure should not be limited to these embodiments but various changes and modifications can be made by one ordinary skilled in the art within the spirit and scope of the present disclosure as hereinafter claimed.

Therefore, the disclosed subject matter should not be limited to any single embodiment described herein, and the scope of the present inventive concept shall be determined according to the attached claims.

What is claimed is:

1. A display panel comprising:
a base substrate;
a transistor disposed on the base substrate and comprising a semiconductor pattern including a source area, a drain area, and an active area, a gate insulating pattern layer disposed on the semiconductor pattern, and a gate electrode disposed on the gate insulating pattern layer; and
connection electrodes disposed on the gate insulating pattern layer and connected to the semiconductor pattern through contact holes, respectively,
wherein the gate insulating pattern layer comprising:
a first portion overlapping at least one of the source area and the drain area and having a first thickness; and
a second portion extending from the first portion and having a second thickness,
wherein the first thickness of the first portion is equal to or smaller than the second thickness of the second portion, and
wherein the first portion is separated from a portion of the gate insulating pattern layer disposed between the gate electrode and the active area, and the portion of the gate insulating pattern layer has the second thickness equal to or greater than the first thickness of the first portion.

2. The display panel of claim 1, wherein the first portion is in contact with at least one of the source area and the drain area.

3. The display panel of claim 2, wherein the first thickness of the first portion is equal to or smaller than about 500 angstroms and is greater than zero.

4. The display panel of claim 1, wherein the second portion extends from the first portion to a first direction in a plan view and a width of the first portion in the first direction is equal to or greater than about 0.2 micrometers and is smaller than a width of each of the contact holes.

5. The display panel of claim 1, wherein the connection electrodes comprise:
a first connection electrode connected to the drain area; and
a second connection electrode connected to the source area, and
wherein the first connection electrode and the second connection electrode are disposed on a same layer as a layer on which the gate electrode is disposed.

6. The display panel of claim 5, wherein each of the first connection electrode and the second connection electrode includes a same material as the gate electrode.

7. The display panel of claim 5, further comprising a first conductive pattern and a second conductive pattern disposed between the base substrate and the transistor and spaced apart from each other in a plan view,
wherein the first conductive pattern is electrically connected to the drain area via the first connection electrode and the second conductive pattern is electrically connected to the source area via the second connection electrode.

8. The display panel of claim 7, wherein the gate insulating pattern layer comprises a first insulating pattern, a second insulating pattern, and a third insulating pattern spaced apart from each other in a plan view,
wherein the first insulating pattern is disposed between the first connection electrode and the semiconductor pattern, the second insulating pattern is disposed between the gate electrode and the semiconductor pattern, and the third insulating pattern is disposed between the second connection electrode and the semiconductor pattern.

9. The display panel of claim 7, wherein the first conductive pattern overlaps the semiconductor pattern in a plan view.

10. The display panel of claim 8, wherein the first connection electrode is connected to the first conductive pattern via a first contact hole defined through the first insulating pattern, wherein the first insulating pattern comprises:

a first portion disposed adjacent to the first contact hole; and a second portion extending from the first portion of the first insulating pattern, and wherein a thickness of the first portion of the first insulating pattern is equal to or smaller than a thickness of the second portion of the first insulating pattern.

11. The display panel of claim 10, further comprising a buffer layer disposed between the gate insulating pattern layer and the first and second conductive patterns, wherein the first contact hole is defined through the buffer layer and the first insulating pattern.

12. The display panel of claim 11, wherein a side surface of the second portion of the first insulating pattern connected to the first portion of the first insulating pattern is disposed on the buffer layer.

13. The display panel of claim 5, further comprising a light emitting element disposed on the first connection electrode and the second connection electrode, wherein the light emitting element comprising a first electrode electrically connected to the transistor via the first connection electrode, a light emitting layer, and a second electrode.

14. The display panel of claim 1, wherein at least one of the source area and the drain area includes a hole, and the hole is adjacent to the first portion.

15. A method of manufacturing a display panel, comprising:

providing a base substrate on which conductive patterns and a preliminary semiconductor pattern are formed;

forming a gate insulating layer on the preliminary semiconductor pattern;

forming contact holes through the gate insulating layer; and forming a connection electrode and a gate electrode on the gate insulating layer, wherein a first portion of the gate insulating layer disposed adjacent to the contact holes and a second portion of the gate insulating layer extending from the first portion are formed through the forming of the contact holes, and wherein a first thickness of the first portion is equal to or smaller than a second thickness of the second portion.

16. The method of claim 15, wherein the forming of the contact holes comprises:

forming a photoresist layer on the gate insulating layer, the photoresist layer including openings;

first etching the gate insulating layer to form the contact holes through the gate insulating layer to overlap the openings;

ashing the photoresist layer to expand a size of each of the openings such that a portion of an upper surface of the gate insulating layer adjacent to the contact holes is exposed; and second etching the gate insulating layer to form the first portion of the gate insulating layer by partially etching the gate insulating layer.

17. The method of claim 16, wherein each of the first etching and the second etching is performed by a dry etching process.

18. The method of claim 16, wherein the first etching is performed using a gas comprising tetrafluoromethane (CF4) and argon (Ar).

19. The method of claim 16, wherein the second etching is performed using a gas comprising nitrogen trifluoride (NF3) and oxygen (O2).

20. The method of claim 16, wherein the ashing is performed using a gas comprising oxygen (O2).

* * * * *